(12) United States Patent
Lee et al.

(10) Patent No.: US 8,792,282 B2
(45) Date of Patent: Jul. 29, 2014

(54) NONVOLATILE MEMORY DEVICES, MEMORY SYSTEMS AND COMPUTING SYSTEMS

(75) Inventors: Ho-Chul Lee, Seoul (KR); Doogon Kim, Hwaseong-si (KR); Jinman Han, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/545,588

(22) Filed: Jul. 10, 2012

(65) Prior Publication Data

US 2012/0275234 A1 Nov. 1, 2012

Related U.S. Application Data

(63) Continuation-in-part of application No. 13/023,934, filed on Feb. 9, 2011, now Pat. No. 8,553,466.

(60) Provisional application No. 61/356,672, filed on Jun. 21, 2010.

(30) Foreign Application Priority Data

Mar. 4, 2010 (KR) .................. 10-2010-0019532
Jul. 12, 2011 (KR) .................. 10-2011-0068826

(51) Int. Cl.
*G11C 11/34* (2006.01)
*G11C 16/16* (2006.01)
*G11C 16/14* (2006.01)
*G11C 16/04* (2006.01)

(52) U.S. Cl.
CPC ............... *G11C 16/16* (2013.01); *G11C 16/14* (2013.01); *G11C 16/0483* (2013.01)
USPC ........... 365/185.29; 365/185.23; 365/185.18; 365/185.14

(58) Field of Classification Search
CPC ..... G11C 16/16; G11C 16/14; G11C 16/0483
USPC .............. 365/185.29, 185.23, 185.18, 185.14
See application file for complete search history.

(56) References Cited

U.S. PATENT DOCUMENTS 5,511,022 A 4/1996 Yim et al.
5,673,223 A 9/1997 Park (Continued)

FOREIGN PATENT DOCUMENTS

JP 08-279295 10/1996
JP 9007383 A 1/1997

(Continued)

OTHER PUBLICATIONS

US Office Action dated Mar. 12, 2013 for related U.S. Appl. No. 12/985,695.

(Continued)

*Primary Examiner* — Viet Q Nguyen
(74) *Attorney, Agent, or Firm* — Harness, Dickey & Pierce, P.L.C.

(57) ABSTRACT

A nonvolatile memory device configured to apply a wordline erase voltage to a plurality of wordlines connected to a plurality of memory cells, apply an erase voltage to a substrate where a memory cell string is formed while applying a specific voltage to at least one ground selection line connected to at least one ground selection transistor, and float the at least one ground selection line when a target voltage of the substrate reaches a target voltage.

20 Claims, 35 Drawing Sheets

(56) References Cited

U.S. PATENT DOCUMENTS

| | | | |
|---|---|---|---|
| 5,715,193 A | 2/1998 | Norman | |
| 5,740,107 A | 4/1998 | Lee | |
| 5,923,587 A | 7/1999 | Choi | |
| 6,009,014 A | 12/1999 | Hollmer et al. | |
| 6,028,788 A | 2/2000 | Choi et al. | |
| 6,285,587 B1* | 9/2001 | Kwon | 365/185.11 |
| 6,295,227 B1 | 9/2001 | Sakui et al. | |
| 6,650,566 B2 | 11/2003 | Jeong et al. | |
| 6,850,439 B1 | 2/2005 | Tanaka | |
| 6,894,924 B2 | 5/2005 | Choi et al. | |
| 6,975,542 B2 | 12/2005 | Roohparvar | |
| 7,064,981 B2* | 6/2006 | Roohparvar | 365/185.17 |
| 7,064,986 B2 | 6/2006 | Lee et al. | |
| 7,079,419 B2 | 7/2006 | Roohparvar | |
| 7,149,124 B2* | 12/2006 | Nazarian | 365/185.27 |
| 7,177,192 B2 | 2/2007 | Yoon et al. | |
| 7,233,522 B2 | 6/2007 | Chen et al. | |
| 7,292,476 B2 | 11/2007 | Goda et al. | |
| 7,403,422 B2 | 7/2008 | Kim et al. | |
| 7,403,429 B2 | 7/2008 | Chae et al. | |
| 7,408,806 B2 | 8/2008 | Park et al. | |
| 7,417,904 B2 | 8/2008 | Sivero et al. | |
| 7,450,433 B2 | 11/2008 | Wan et al. | |
| 7,480,178 B2 | 1/2009 | Park et al. | |
| 7,489,556 B2 | 2/2009 | Tanzawa | |
| 7,518,920 B2 | 4/2009 | Kang | |
| 7,529,138 B2 | 5/2009 | Park et al. | |
| 7,532,514 B2 | 5/2009 | Cernea et al. | |
| 7,551,477 B2 | 6/2009 | Mokhlesi et al. | |
| 7,551,487 B2 | 6/2009 | Park et al. | |
| 7,551,492 B2* | 6/2009 | Kim | 365/185.29 |
| 7,566,927 B2 | 7/2009 | Kim et al. | |
| 7,606,074 B2 | 10/2009 | Wan et al. | |
| 7,633,803 B2 | 12/2009 | Lee | |
| 7,652,931 B2 | 1/2010 | Park et al. | |
| 7,668,014 B2 | 2/2010 | Hwang | |
| 7,724,577 B2 | 5/2010 | Goda et al. | |
| 7,778,078 B2 | 8/2010 | Nagadomi et al. | |
| 7,778,084 B2 | 8/2010 | Kim et al. | |
| 7,813,184 B2 | 10/2010 | Kim et al. | |
| 7,859,902 B2 | 12/2010 | Maejima | |
| 7,888,731 B2 | 2/2011 | Kim | |
| 7,924,629 B2 | 4/2011 | Park et al. | |
| 7,933,151 B2* | 4/2011 | Maeda et al. | 365/185.11 |
| 7,936,004 B2 | 5/2011 | Kito et al. | |
| 7,936,617 B2 | 5/2011 | Sudo | |
| 7,940,572 B2 | 5/2011 | Kim | |
| 7,952,136 B2 | 5/2011 | Kito et al. | |
| 7,983,084 B2 | 7/2011 | Tokiwa et al. | |
| 8,013,389 B2 | 9/2011 | Oh et al. | |
| 8,023,321 B2 | 9/2011 | Kim | |
| 8,125,825 B2 | 2/2012 | Seol | |
| 8,149,635 B2 | 4/2012 | Lee | |
| 8,169,826 B2 | 5/2012 | Hishida et al. | |
| 8,189,391 B2* | 5/2012 | Itagaki et al. | 365/185.17 |
| 8,228,733 B2 | 7/2012 | Tokiwa et al. | |
| 8,243,518 B2 | 8/2012 | Oh et al. | |
| 8,274,108 B2 | 9/2012 | Katsumata et al. | |
| 8,318,602 B2 | 11/2012 | Kito et al. | |
| 8,467,246 B2 | 6/2013 | Kim et al. | |
| 8,570,805 B2 | 10/2013 | Lee | |
| 8,582,372 B2 | 11/2013 | Kim | |
| 8,638,608 B2 | 1/2014 | Lai et al. | |
| 2002/0007131 A1 | 1/2002 | Zemont | |
| 2002/0071311 A1 | 6/2002 | Jeong et al. | |
| 2005/0000669 A1 | 1/2005 | West | |
| 2005/0006692 A1 | 1/2005 | Kim et al. | |
| 2005/0141283 A1 | 6/2005 | Lee et al. | |
| 2005/0248991 A1 | 11/2005 | Lee et al. | |
| 2006/0050594 A1 | 3/2006 | Park | |
| 2006/0140012 A1 | 6/2006 | Wan et al. | |
| 2007/0018320 A1 | 1/2007 | Tanida et al. | |
| 2007/0029723 A1 | 2/2007 | Sato | |
| 2007/0070701 A1 | 3/2007 | Kim et al. | |
| 2007/0158736 A1 | 7/2007 | Arai et al. | |
| 2007/0159886 A1 | 7/2007 | Kang | |
| 2007/0183204 A1 | 8/2007 | Kim et al. | |
| 2007/0230253 A1 | 10/2007 | Kim | |
| 2007/0252201 A1 | 11/2007 | Kito et al. | |
| 2007/0297234 A1 | 12/2007 | Cernea et al. | |
| 2008/0007999 A1 | 1/2008 | Park et al. | |
| 2008/0027901 A1 | 1/2008 | Sanborn | |
| 2008/0099819 A1 | 5/2008 | Kito et al. | |
| 2008/0173928 A1 | 7/2008 | Arai et al. | |
| 2008/0173933 A1 | 7/2008 | Fukuzumi et al. | |
| 2008/0181020 A1 | 7/2008 | Yu et al. | |
| 2008/0253183 A1 | 10/2008 | Mizukami et al. | |
| 2008/0279012 A1 | 11/2008 | Lee | |
| 2009/0002182 A1 | 1/2009 | Knox et al. | |
| 2009/0002198 A1 | 1/2009 | Bach | |
| 2009/0003075 A1 | 1/2009 | Kim et al. | |
| 2009/0021983 A1 | 1/2009 | Wan et al. | |
| 2009/0021988 A1 | 1/2009 | Hong et al. | |
| 2009/0027935 A1 | 1/2009 | Nakata et al. | |
| 2009/0097309 A1 | 4/2009 | Mizukami et al. | |
| 2009/0122613 A1 | 5/2009 | Kim et al. | |
| 2009/0168533 A1 | 7/2009 | Park et al. | |
| 2009/0172267 A1 | 7/2009 | Oribe et al. | |
| 2009/0175081 A1 | 7/2009 | Kim | |
| 2009/0180323 A1 | 7/2009 | Park et al. | |
| 2009/0268524 A1 | 10/2009 | Maejima | |
| 2009/0279359 A1 | 11/2009 | Goda et al. | |
| 2009/0316491 A1 | 12/2009 | Park et al. | |
| 2010/0038703 A1 | 2/2010 | Fukuzumi et al. | |
| 2010/0124120 A1 | 5/2010 | Park et al. | |
| 2010/0159657 A1 | 6/2010 | Arai et al. | |
| 2010/0177566 A1 | 7/2010 | Kim et al. | |
| 2010/0195395 A1 | 8/2010 | Jeong et al. | |
| 2010/0238732 A1 | 9/2010 | Hishida et al. | |
| 2011/0063913 A1 | 3/2011 | Maejima | |
| 2011/0170352 A1 | 7/2011 | Kim | |
| 2011/0189853 A1 | 8/2011 | Kito et al. | |
| 2011/0199825 A1 | 8/2011 | Han et al. | |
| 2011/0216603 A1* | 9/2011 | Han et al. | 365/185.23 |
| 2011/0238913 A1 | 9/2011 | Kurashige et al. | |
| 2012/0099377 A1 | 4/2012 | Maejima | |
| 2012/0275234 A1 | 11/2012 | Lee et al. | |
| 2013/0182502 A1* | 7/2013 | Cheo et al. | 365/185.2 |
| 2014/0022846 A1 | 1/2014 | Kim | |

FOREIGN PATENT DOCUMENTS

| | | |
|---|---|---|
| JP | 10-032269 A | 2/1998 |
| JP | H10-093083 A | 4/1998 |
| JP | 2000-222895 A | 8/2000 |
| JP | 2002203393 A | 7/2002 |
| JP | 2005032430 A | 2/2005 |
| JP | 2005-116119 A | 4/2005 |
| JP | 2005196931 A | 7/2005 |
| JP | 2006-073168 A | 3/2006 |
| JP | 2007087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007272952 A | 10/2007 |
| JP | 2007-323716 A | 12/2007 |
| JP | 2008-103429 A | 5/2008 |
| JP | 2008-172164 A | 7/2008 |
| JP | 2008-311650 A | 12/2008 |
| JP | 2009-026369 A | 2/2009 |
| JP | 2009-088446 A | 4/2009 |
| JP | 2009124107 A | 6/2009 |
| JP | 2009-266281 | 11/2009 |
| JP | 2011-508937 A | 3/2011 |
| KR | 100157342 B1 | 7/1998 |
| KR | 10-0390145 B1 | 7/2003 |
| KR | 100541819 B1 | 1/2006 |
| KR | 20060129806 A | 12/2006 |
| KR | 10-0672151 | 1/2007 |
| KR | 100688494 B1 | 3/2007 |
| KR | 100706797 B1 | 4/2007 |
| KR | 100729359 B1 | 6/2007 |
| KR | 2007-0078355 A | 7/2007 |

(56) References Cited

FOREIGN PATENT DOCUMENTS

| | | |
|---|---|---|
| KR | 2007-0096972 A | 10/2007 |
| KR | 10-0784862 B1 | 12/2007 |
| KR | 2008-0005765 A | 1/2008 |
| KR | 2008-0110168 A | 12/2008 |
| KR | 2009-0002471 A | 1/2009 |
| KR | 10-0884861 A | 2/2009 |
| KR | 100890016 B1 | 3/2009 |
| KR | 2009-0034776 A | 4/2009 |
| KR | 100897415 B1 | 5/2009 |
| KR | 20090048877 A | 5/2009 |
| KR | 10-2009-0072406 | 7/2009 |
| KR | 20090079037 A | 7/2009 |
| KR | 2011-0095104 | 8/2011 |
| WO | WO-2009/086618 A1 | 7/2009 |

OTHER PUBLICATIONS

US Office Action dated Apr. 5, 2013 for related U.S. Appl. No. 13/029,518.
US Office Action dated Jan. 15, 2013 for related U.S. Appl. No. 13/023,934.
US Office Action dated Jan. 15, 2013 for related U.S. Appl. No. 13/028,918.
Jaehoon Jang et al, "Vertical Cell Array using TCAT (Terabit Cell Array Transistor) Technology for Ultra High Density NAND Flash Memory", VLSI Symp. Tech. Dig., pp. 192-193, 2009.
US Office Action dated Jul. 23, 2013 for related U.S. Appl. No. 13/211,743.
US Office Action dated Dec. 24, 2013 for related U.S. Appl. No. 13/867,716.
US Office Action dated Jan. 2, 2014 for related U.S. Appl. No. 12/985,695.
Notice of Allowance dated Oct. 11, 2013 in corresponding U.S. Appl. No. 13/967,455.
Office Action dated Nov. 5, 2013 in corresponding U.S. Appl. No. 14/043,256.
Office Action dated Aug. 30, 2013 in corresponding U.S. Appl. No. 12/985,695.
Notice of Allowance dated Feb. 7, 2014 for related U.S. Appl. No. 13/967,455.
US Office Action dated Feb. 14, 2014 for related U.S. Appl. No. 14/029,100.
U.S. Office Action dated Feb. 28, 2014 from related U.S. Appl. No. 13/721,963.
Notice of Allowance dated Mar. 11, 2014 from related U.S. Appl. No. 13/545,588.
Japanese Office Action, Japanese application No. 2011-012074, Apr. 1, 2014.
Notice of Allowance, U.S. Appl. No. 12/985,695, Apr. 29, 2014.
Office Action, U.S. Appl. No. 13/607,308, Mar. 21, 2014.
Japanese Examination report for corresponding Japanese application No. 2011-012072 dated Apr. 8, 2014.

* cited by examiner

Fig. 7

| SSL | Float |
| --- | --- |
| WL | Vwe |
| GSL | Float |
| Substrate | Vers |

Fig. 10

| SSL | Float |
|---|---|
| WL | Vwe |
| GSL | Vss → Float |
| Substrate | Vers |

NONVOLATILE MEMORY DEVICES, MEMORY SYSTEMS AND COMPUTING SYSTEMS

CROSS-REFERENCE TO RELATED APPLICATIONS

This application is a continuation-in-part (CIP) of U.S. application Ser. No. 13/023,934, filed Feb. 9, 2011, and claims priority under 35 U.S.C. §119 to Korean Patent Application No. 2011-0068826 filed on Jul. 12, 2011, in the Korean Intellectual Property Office (KIPO), the entire contents of each of which are incorporated herein by reference.

BACKGROUND

1. Field

Example embodiments relate to semiconductor memories and, more particularly, to nonvolatile memory devices and erasing methods thereof.

2. Description of the Related Art

A semiconductor memory device is a memory device that is implemented with semiconductor materials such as silicon (Si), germanium (Ge), gallium arsenide (GaAs) and indium phosphide (InP). Semiconductor memory devices may be largely divided into a volatile memory device and a nonvolatile memory device.

The volatile memory device is a memory device in which stored data is erased when a power source is shut off. Examples of volatile memory devices include Static Random Access Memory (SRAM), Dynamic Random Access Memory (DRAM) and Synchronous Dynamic Random Access Memory (SDRAM). A nonvolatile memory device is a memory device that retains stored data even when a power source is shut off. Examples of nonvolatile memory devices include Read-Only Memory (ROM), Programmable Read Only Memory (PROM), Erasable Programmable Read Only Memory (EPROM), Electrical Erasable Programmable Read Only Memory (EEPROM), flash memory devices, Phase-change Random Access Memory (PRAM), Magnetoresistive Random Access Memory (MRAM), Resistive Random Access Memory (RRAM) and Ferroelectric Random Access Memory (FRAM). Flash memory devices may be largely categorized into a NOR type and a NAND type.

SUMMARY

Example embodiments of the inventive concepts provide nonvolatile memory devices, computing systems and memory systems.

According to some example embodiments of the inventive concepts, a nonvolatile memory device may include a memory cell array including a plurality of memory cell strings provided on a substrate, a read and write circuit connected to the memory cell strings through bitlines and configured to drive the bitlines, a substrate bias circuit configured to supply an erase voltage to the substrate during an erase operation, an address decoder connected to the memory cell strings through a plurality of wordlines, at least one string selection line, and at least one ground selection line and configured to supply a low voltage to the at least one ground selection line and the wordlines during the erase operation, a program circuit configured to store time information and a counter configured to start counting when the erase voltage is supplied to the substrate during the erase operation. The address decoder is further configured to float the at least one ground selection line when a count value of the counter matches the time information.

According to at least one example embodiment, the low voltage may be a ground voltage. According to at least one example embodiment, the time information may be set such that a difference between a voltage of the substrate and a voltage of the at least one ground selection line ranges from 3.5 volts to 11 volts. According to at least one example embodiment, the program circuit may be a part of the memory cell array. According to at least one example embodiment, each of the memory cell strings may include at least one ground selection transistor, a plurality of memory cells, and at least one string selection transistor which are stacked in a direction perpendicular to the substrate.

According to at least one example embodiment, the memory cell array may include a plurality of structures including conductive materials and insulating materials which are alternately stacked in the direction perpendicular to the substrate and a plurality of pillars connected to the substrate in the direction perpendicular to the substrate through the structures. The structures and the pillar constitute the memory cell strings. According to at least one example embodiment, the memory cell array may further include a plurality of doping regions provided at a portion between the structures in the substrate. The doping regions may constitute a common source line commonly connected to the cell strings. According to at least one example embodiment, the memory cell array may further include a plurality of insulating layers provided between the conductive materials and the pillars.

According to other example embodiments of the inventive concepts, a nonvolatile memory device may include memory cell array including a plurality of memory cell strings provided on a substrate, a read and write circuit connected to the memory cell strings through bitlines and configured to drive the bitlines, a substrate bias circuit configured to supply an erase voltage to the substrate during an erase operation, an address decoder connected to the memory cell strings through a plurality of wordlines, at least one string selection line, and at least one ground selection line and configured to supply a low voltage to the at least one ground selection line and the wordlines during the erase operation, a substrate monitor circuit configured to monitor a voltage level of the substrate and output a monitoring result during the erase operation, and a program circuit configured to store target voltage information. Based on the monitoring result, the address decoder may be further configured to float the at least one ground selection line when the voltage level of the substrate matches the target voltage information.

According to at least one example embodiment, the substrate monitor circuit may include first and second trimmers coupled between a ground node and a substrate node to which a voltage of the substrate is supplied and a comparator configured to compare a target voltage with a voltage at a node between the first and second trimmers and output a result of the comparison. According to an example embodiment, the target voltage information may indicate a voltage level ranging from 3.5 volts to 11 volts. According to at least one example embodiment, the program circuit may be a part of the memory cell array.

According to at least one example embodiment, a nonvolatile memory device includes a memory cell array including a plurality of memory cell strings on a substrate, a read and write circuit connected to the memory cell strings through a plurality of bitlines, the read and write circuit configured to drive the bitlines, a substrate bias circuit configured to supply an erase voltage to the substrate during an erase operation, a program circuit configured to store time information, a counter configured to start counting when the erase voltage is supplied to the substrate during the erase operation and an address decoder connected to the memory cell strings through a plurality of wordlines, at least one string selection line, and at least one ground selection line, the address decoder configured to supply a low voltage to the at least one ground selection line and the wordlines during the erase operation, the address decoder configured to float the at least one ground selection line when a count value of the counter matches the time information.

According to at least one example embodiment, a nonvolatile memory device, includes a memory cell array including a plurality of memory cell strings on a substrate, a read and write circuit connected to the memory cell strings through a plurality of bitlines, the read and write circuit configured to drive the bitlines, a substrate bias circuit configured to supply an erase voltage to the substrate during an erase operation, a substrate monitor circuit configured to monitor a voltage level of the substrate and output a monitoring result during the erase operation, a program circuit configured to store target voltage information and an address decoder connected to the memory cell strings through a plurality of wordlines, at least one string selection line, and at least one ground selection line, the address decoder configured to supply a low voltage to the at least one ground selection line and the wordlines during the erase operation, the address decoder configured to, based on the monitoring result, float the at least one ground selection line when the voltage level of the substrate matches the target voltage information.

According to at least one example embodiment, a nonvolatile memory device includes an address decoder configured to, during a vertical memory string erase operation, supply a low voltage to at least one selection line and a plurality of wordlines, and to at least one of float the at least one selection line when a count value of a counter matches a target value, and float the at least one selection line upon a voltage level of a substrate matching target voltage information.

BRIEF DESCRIPTION OF THE DRAWINGS

Example embodiments will be more clearly understood from the following brief description taken in conjunction with the accompanying drawings. FIGS. 1-34 represent non-limiting, example embodiments as described herein.

FIG. 1 is a block diagram illustrating nonvolatile memory devices according to at least one example embodiment of the inventive concepts;

FIG. 2 is a block diagram illustrating a memory cell array of FIG. 1;

FIG. 3 is a perspective diagram illustrating at least one example embodiment of a memory block of FIG. 2;

FIG. 4 is a cross-sectional diagram taken along the line IV-IV' of the memory block shown in FIG. 3;

FIG. 5 is a cross-sectional diagram illustrating a transistor structure shown in FIG. 4;

FIG. 6 is a circuit diagram of an equivalent circuit according to at least one example embodiment of a memory block described with reference to FIGS. 3-5;

FIG. 7 is a table illustrating at least one example embodiment of a voltage condition during an erase operation of a nonvolatile memory device of FIG. 1;

FIG. 8 is a cross-sectional diagram and a band diagram illustrating a NAND string in a memory block described with reference to FIGS. 3-6;

FIG. 9 is a flowchart illustrating erase methods of a nonvolatile memory device of FIG. 1;

FIG. 10 is a table illustrating an erase voltage condition according to an erase method of FIG. 9;

FIG. 11 is a timing diagram illustrating voltage variation of an erase method of FIG. 9 under an erase voltage condition of FIG. 10;

FIG. 12 is a graphic diagram illustrating an amount of current flowing through a second-direction body;

FIG. 13 is a graphic diagram illustrating threshold voltage variation of memory cells, ground selection transistors, and string selection transistors when an erase operation according to at least one example embodiment of the inventive concepts is performed;

FIG. 14 is a graphic diagram illustrating change in a target voltage range according to rise time and applying time of an erase voltage;

FIG. 15 is a block diagram illustrating a substrate monitor circuit of FIG. 1.

FIG. 16 is a circuit diagram illustrating an up-trimmer of FIG. 15;

FIG. 18 is a circuit diagram illustrating application examples of an equivalent circuit in a memory block described with reference to FIGS. 3-5;

FIG. 19 is a circuit diagram illustrating other application examples of an equivalent circuit in a memory block described with reference to FIGS. 3-5;

FIG. 20 is a circuit diagram illustrating still other application examples of an equivalent circuit in a memory block described with reference to FIGS. 3-5;

FIG. 21 is a circuit diagram illustrating yet other application examples of an equivalent circuit in a memory block described with reference to FIGS. 3-5;

FIG. 22 is a circuit diagram illustrating yet still other application examples of an equivalent circuit in a memory block described with reference to FIGS. 3-5;

FIG. 23 is a perspective diagram illustrating other example embodiments of a memory block of FIG. 2;

FIG. 24 is a perspective diagram illustrating still other example embodiments of a memory block of FIG. 2;

FIG. 25 is a cross-sectional diagram taken along the line XXV-XXV' of a memory block shown in FIG. 24;

FIG. 26 is a perspective diagram illustrating further example embodiments of a memory block of FIG. 2;

FIG. 27 is a cross-sectional diagram taken along the line XXVII-XXVII' of the memory block shown in FIG. 26;

FIG. 28 is a block diagram illustrating nonvolatile memory devices according to other example embodiment of the inventive concepts;

FIG. 29 is a block diagram illustrating nonvolatile memory devices according to still other example embodiments of the inventive concepts;

FIG. 30 is a block diagram illustrating nonvolatile memory devices according to yet other example embodiments of the inventive concepts;

FIG. 31 is a block diagram illustrating nonvolatile memory devices according to yet still other example embodiments of the inventive concepts;

FIG. 32 is a block diagram illustrating a memory system including the nonvolatile memory device shown in FIG. 1;

FIG. 33 is a block diagram illustrating application examples of a memory system of FIG. 32; and FIG. 34 is a block diagram illustrating computing systems including a memory system described with reference to FIG. 33.

Figure 1:
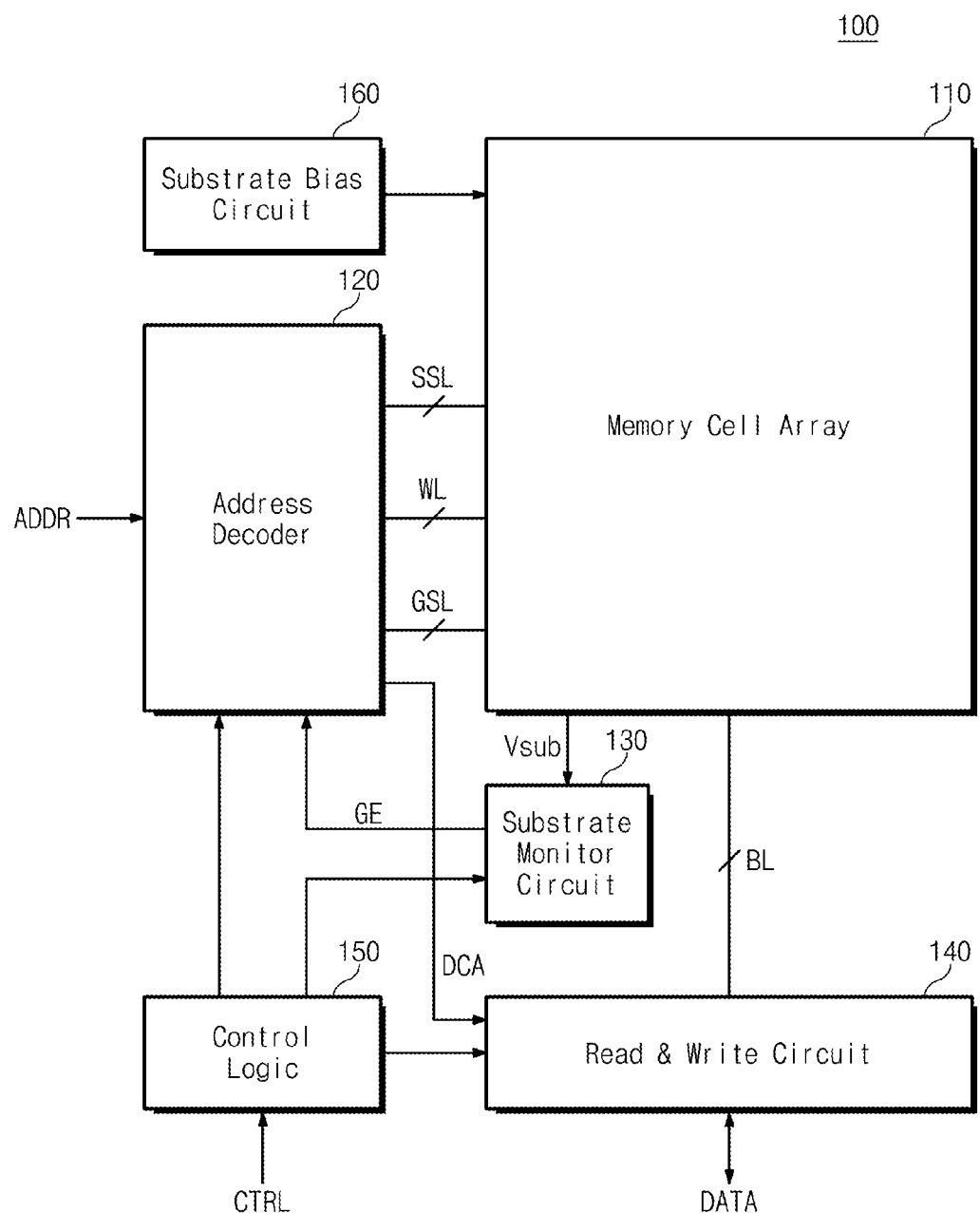

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating nonvolatile memory devices 100 according to at least one example embodiment of the inventive concepts. A nonvolatile memory device 100 may include a memory cell array 110, an address decoder 120, a substrate monitor circuit 130, a read and write circuit 140, a control logic 150 and a substrate bias circuit 160.

The memory cell array 110 may be connected to the address decoder 120 through selection lines that may include word lines WL, string selection lines SSL and ground selection lines GSL. The memory cell array 110 may be connected to the read and write circuit 140 through bitlines BL. The memory cell array 110 may be connected to the substrate monitor circuit 130. For example, a substrate on which the memory cell array 110 may be formed may be connected to the substrate monitor circuit 130. The memory cell array 110 may be connected to the substrate bias circuit 160. For example, the substrate on which the memory cell array 110 may be formed may be connected to the substrate bias circuit 160.

The memory cell array 110 may include a plurality of memory blocks each including a plurality of memory cell strings. For example, each of the memory blocks may include a plurality of NAND strings. Each of the memory cell strings may include a plurality of memory cells and a plurality of selection transistors. For example, each of the memory cell strings may include at least one string selection transistor and at least one ground selection transistor.

Memory cells arranged in a row direction may be connected to wordlines WL. Memory cells arranged in a column direction may be connected to bitlines BL. For example, the memory cells arranged in the column direction may configure a plurality of cell groups (e.g., a string). The cell groups may be connected to the bitlines BL, respectively. At least one string selection transistor may be connected to string selection lines SSL. At least one ground selection transistor may be connected to ground selection lines GSL. The memory cell array 110 may be configured to store one or more bits in each cell.

The address decoder 120 may be connected to the memory cell array 110 through the wordlines WL, the string selection lines SSL, and the ground selection lines GSL. The address decoder 120 may be configured to operate in compliance with the control of the control logic 150. The address decoder 120 may receive an external address ADDR.

The address decoder 120 may be configured to decode a row address of the received address ADDR. The address decoder 120 may select a memory block of the memory cell array 110 by using the decoded row address. The address decoder 120 may select wordlines WL, string selection lines SSL, and ground selection lines GSL of the selected memory block by using the decoded row address. The address decoder 120 may be configured to additionally decode a column address of the received address ADDR. The decoded column address DCA may be transferred to the read and write circuit 140.

The address decoder 120 may be configured to receive a ground enable signal GE from the substrate monitor circuit 130. The address decoder 120 may be configured to control an output voltage in response to the received ground enable signal GE. For example, the address decoder 120 may be configured to operate in response to the ground enable signal GE during an erase operation.

The substrate monitor circuit 130 may be connected to the memory cell array 110 and the address decoder 120. The substrate monitor circuit 130 may be configured to operate in compliance with the control of the control logic 150. The substrate monitor circuit 130 may monitor a substrate voltage Vsub of the memory cell array 110. The substrate monitor circuit 130 may activate or deactivate the ground enable signal GE according to the level of the substrate voltage Vsub of the substrate of the memory cell array 110. The ground enable signal GE may be transferred to the address decoder 120. For example, the substrate monitor circuit 130 may be enabled during an erasing operation.

The read and write circuit 140 may be connected to the memory cell array 110 through the bitlines BL. The read and write circuit 140 may operate in compliance with the control of the control logic 150. The read and write circuit 140 may be configured to receive the decoded column address from the address decoder 120. The read and write circuit 140 may select bitlines BL by using the decoded column address.

The read and write circuit 140 may be configured to externally receive data DATA and may write the received data DATA into the memory cell array 110. The read and write circuit 140 may be configured to read the written data DATA from the memory cell array 110 and may output the read data DATA to an external destination. The read and write circuit 140 may be configured to read data from a first storage region of the memory cell array 110 and may write the read data in a second storage region of the memory cell array 110. For example, the read and write circuit 140 may be configured to perform a copy-back operation.

The read and write circuit 140 may include well-known elements such as a page buffer (or page register) and a column selection circuit. As another example, the read and write circuit 140 may include well-known elements such as a sense amplifier, a write driver, and a column selection circuit.

The control logic 150 may be connected to the address decoder 120, the substrate monitor circuit 130, and the read and write circuit 140. For example, the control logic 150 may be additionally connected to the substrate bias circuit 160. The control logic 150 may be configured to control the overall operation of the nonvolatile memory device 100. The control logic 150 may operate in response to a control signals CTRL transferred externally.

The substrate bias circuit 160 may operate in compliance with the control of the control logic 150. The substrate bias circuit 160 may be configured to bias the substrate on which the memory cell array 110 may be formed. For example, the substrate bias circuit 160 may be configured to bias an erase voltage Vers to the substrate on which the memory cell array 110 may be formed. According to other example embodiments, the substrate monitor circuit 130 may be omitted. The address decoder 120 may drive the ground selection line GSL in an erase operation by waiting a target delay time before applying a voltage to the substrate of the memory cell array 110.

Figure 2:
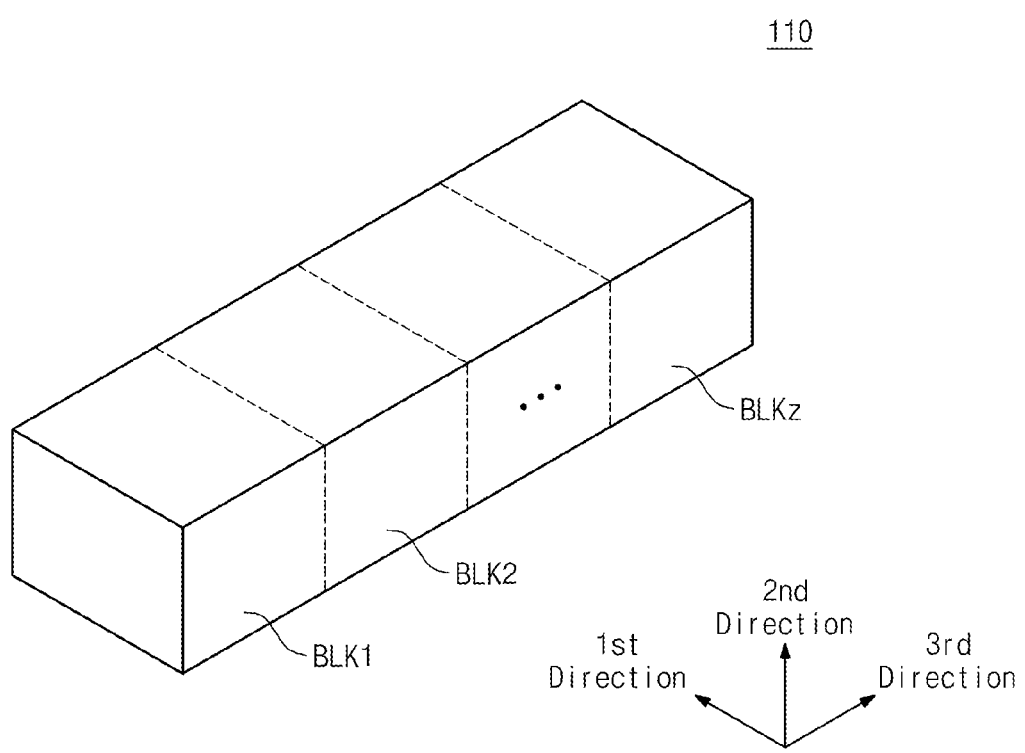

FIG. 2 is a block diagram illustrating a memory cell array of FIG. 1. Referring to FIG. 2, the memory cell array 110 may include a plurality of memory blocks BLK1-BLKz. Each of the memory blocks BLK may have a three-dimensional structure (or vertical structure). For example, each memory block BLK may include structures extending in first to third directions. For example, each memory block BLK may include a plurality of NAND strings NS that may extend in the second direction. For example, a plurality of NAND strings NS may be provided in the first and third directions. Each NAND string NS may be connected to a bitline BL, a string select line SSL, a ground select line GSL, the wordlines WL, and a common source line CSL. Each of the memory blocks may be connected to the plurality of bitlines BL, the plurality of string select lines SSL, the plurality of ground select lines GSL, the plurality of wordlines WL, and the common source line CSL.

The memory blocks BLK1-BLKz may be selected by the address decoder 120 illustrated in FIG. 1. For example, the address decoder 120 may be configured to select at least one memory block BLK corresponding to a decoded one of the memory blocks BLK1-BLKz.

Figure 3:
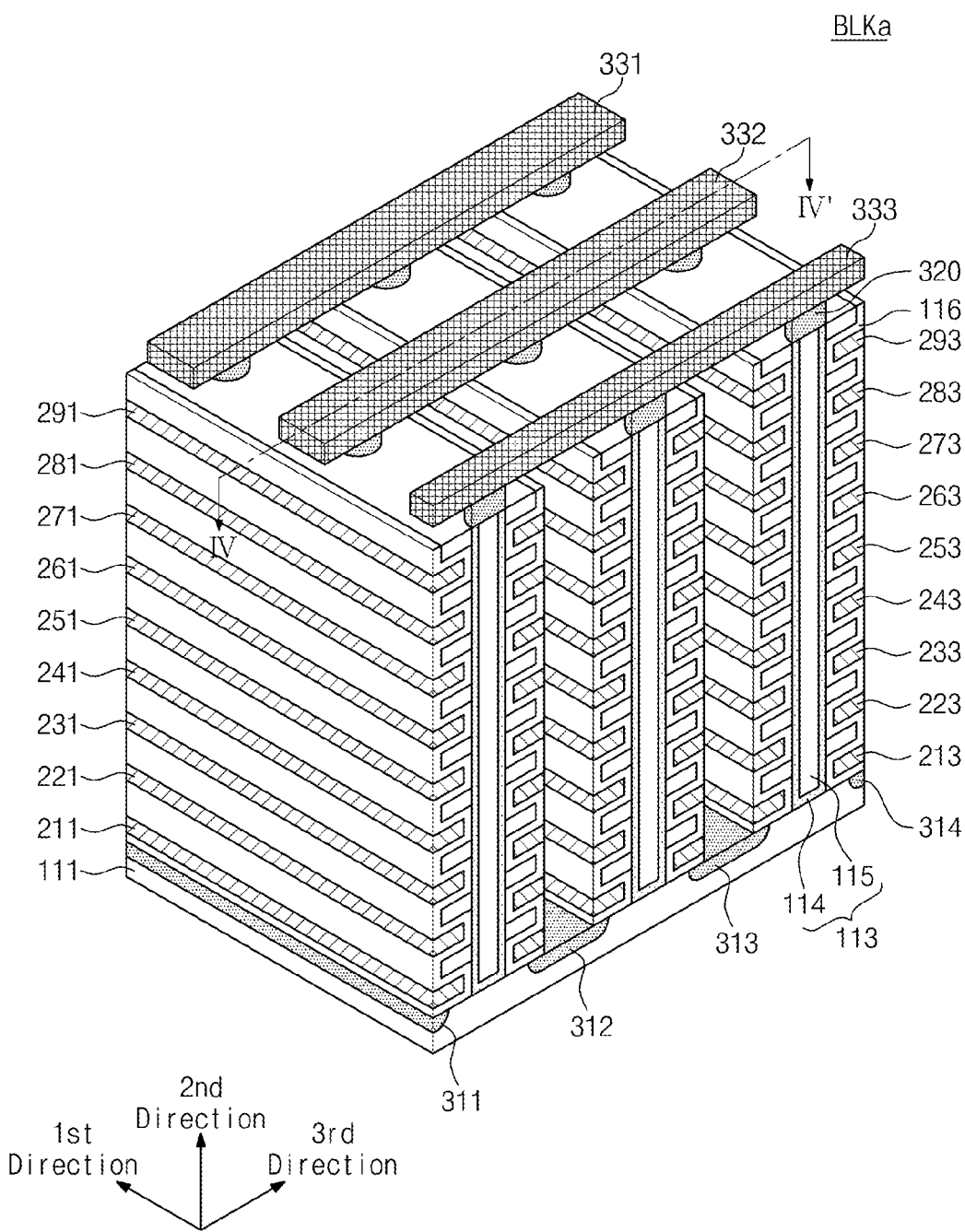
Figure 4:
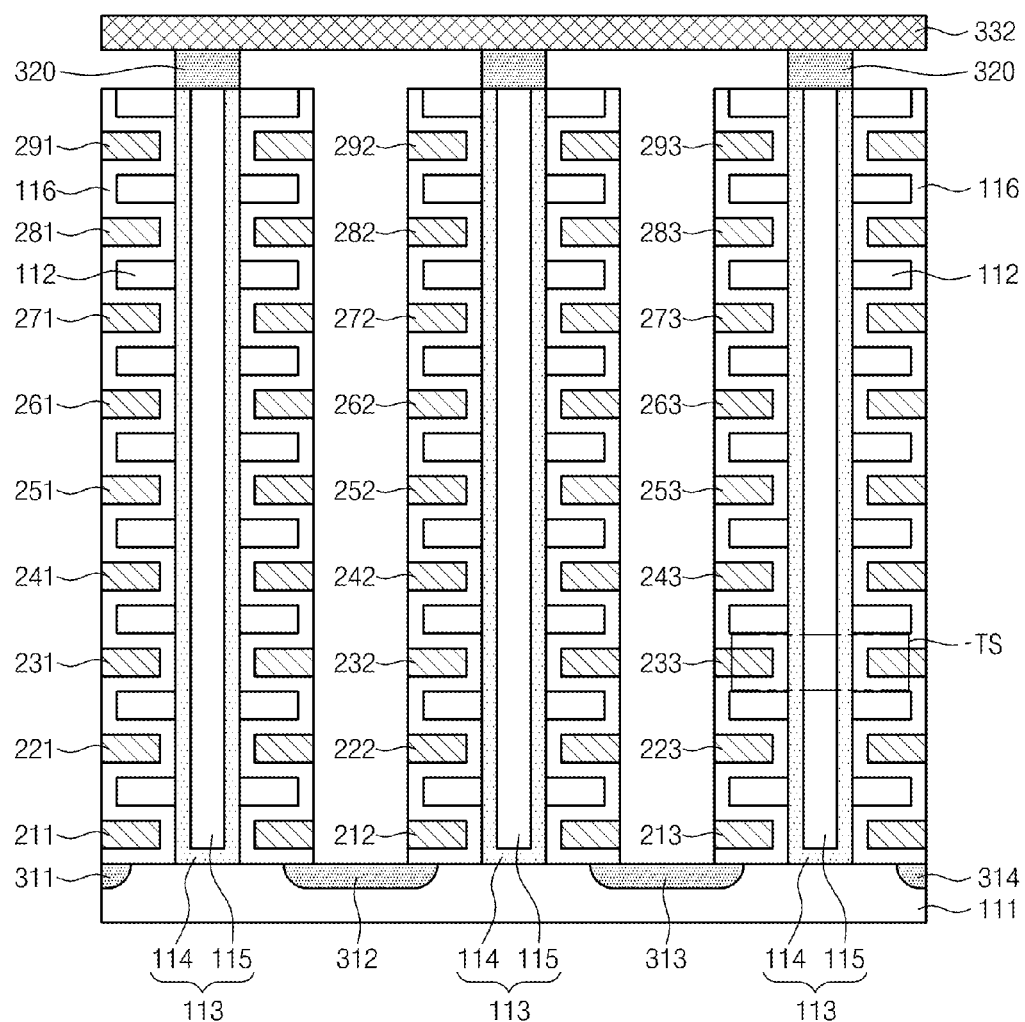

FIG. 3 is a perspective diagram illustrating at least one example embodiment of a memory block BLKa of FIG. 2. FIG. 4 is a cross-sectional diagram taken along the line IV-IV' of the memory block shown in FIG. 3. Referring to FIGS. 3 and 4, the memory block BLKa may include structures extending in the first to third directions. A substrate 111 may be provided. The substrate 111 may be a well having a first conductivity type. For example, the substrate 111 may be a p-type well formed by implanting Group III elements (e.g., boron (B)). For example, the substrate 111 may be a p-type pocket well provided in an n-type well. Hereinafter, it may be assumed that the substrate 111 may be a p-type well. However, the conductivity type of the substrate 111 is not limited to the p-type well.

A plurality of doping regions 311-314 that may extend in a first direction may be provided on the substrate 111. For example, the doping regions 311-314 may have a second conductivity type differing from that of the substrate 111. Hereinafter, it may be assumed that the first to fourth doping regions 311-314 have an n-type conductivity. However, the conductivity types of the first to fourth doping regions 311-314 are not limited to n-type.

A plurality of insulating materials 112 that may extend in the first direction may be sequentially provided in a second direction over a region of the substrate 111 between the first and second doping regions 311 and 312. For example, the insulating materials 112 may be provided in the second direction to be spaced by a distance. The insulating material 112 may include an insulator (e.g., silicon oxide).

A plurality of pillars 113 may be provided, which may be disposed in the first direction on the region of the substrate 111 between the first and second doping regions 311 and 312 through the insulating materials 112 in the second direction. The pillars 113 may be connected to the substrate 111 through the insulating materials 112. Each of the pillars 113 may comprise a plurality of materials. For example, a surface layer 114 of each pillar 113 may include first-type silicon, intrinsic silicon or second-type silicon. For example, the surface layer 114 of each pillar 113 may include a silicon material having the same conductivity type as the substrate 111. Hereinafter, it may be assumed that the surface layer 114 of each pillar 113 may include p-type silicon. However, the surface layer 114 of each pillar 113 is not limited to including the p-type silicon.

An inner layer 115 of each pillar 113 may include an insulating material. For example, the inner layer 115 of each pillar 113 may include, for example, silicon oxide. For example, the inner layer 115 of each pillar 113 may include an air gap. In a region between the first and second doping regions 311 and 312, an insulating layer 116 may be provided along exposed surfaces of the insulating materials 112, the pillars 113, and the substrate 111. The insulating layer 116 that may be provided on the exposed surface of the last insulating material 112 disposed in the second direction may be removed along the second direction.

A thickness of the insulating material 116 may be less than half the distance between the insulating materials 112. Any material other than the insulating materials 112 and the insulating layer 116 may be disposed in a region which may be provided between the insulating layer 116 that may be provided on a bottom surface of the first insulating material and the insulating layer 116 that may be provided on a top surface of the second insulating material below the first insulating material.

In the region between the first and second doping regions 311 and 312, first conductive materials 211-291 may be on an exposed surface of the insulating layer 116. For example, the first conductive material 211 that may extend in the first direction may be provided between the substrate 111 and the insulating layer 112 adjacent thereto. The first conductive material 211 that may extend in the first direction may be provided between the substrate 111 and the insulating layer 116 that may be disposed below the insulating material 112 adjacent to the substrate 111.

A first conductive material that may extend in the first direction may be provided between the insulating layer 116 on a top surface of a specific insulating material and an insulating layer 116 on a bottom surface of an insulating material that may be disposed on the specific insulating material among the insulating materials 112. A plurality of first conductive materials 221-291 that may extend in the first direction may be provided between the insulating materials 112. Each of the first conductive materials 211-291 may be a metallic material. Each of the first conductive materials 211-291 may be a conductive material (e.g., polysilicon).

The same structure as that disposed on the first and second doping regions 311 and 312 may be provided in a region between the second and third doping regions 312 and 313. The plurality of insulating materials 112 that may extend in the first direction, the plurality of pillars 113 which may be sequentially arranged in the first direction and may penetrate the plurality of insulating materials 112 in the third direction, the insulating layer 116 that may be provided on the plurality of insulating materials 112 and the exposed surface of the plurality of pillars 112, and the plurality of first conductive materials 212-292 that may extend in the first direction may be provided in the region between the second and third doping regions 312 and 313.

The same structure as that disposed on the first and second doping regions 311 and 312 may be provided in a region between the third and fourth doping regions 313 and 314. The plurality of insulating materials 112 that may extend in the first direction, the plurality of pillars 113 which may be sequentially arranged in the first direction and may penetrate the plurality of insulating materials 112 in the third direction, the insulating layer 116 that may be provided on the plurality of insulating materials 112 and the exposed surface of the plurality of pillars 112, and the plurality of first conductive materials 213-293 that may extend in the first direction may be provided in the region between the third and fourth doping regions 313 and 314.

Drains 320 may be provided on the pillars 113, respectively. Each of the drains 320 may include a silicon material doped with a second-type dopant. For example, each of the drains 320 may include a silicon material doped with an n-type dopant. Hereinafter, it may be assumed that each of the drains 320 may include a silicon material doped with an n-type dopant. However, each of the drains 320 is not limited to including the n-type silicon material. The width of each drain 320 may be greater than that of a corresponding pillar 113. For example, each drain 320 may be provided in the shape of a pad on a top surface of a corresponding pillar 113.

Second conductive materials 331-333 that may extend in the third direction may be provided on the drains 320. The second conductive materials 331-333 may be sequentially arranged in the first direction. The second conductive materials 331-333 may be connected to the drains 320 in the corresponding region, respectively. The drains 320 and the second conductive material 333 that may extend in the third direction may be connected to each other through contact plugs, respectively. Each of the second conductive materials 331-333 may be a metallic material. Each of the second conductive materials 331-333 may be, for example, polysilicon.

An insulating layer (not shown) may be further provided between a bottom surface of the insulating layer 116 and the substrate 111. The insulating layer (not shown) additionally provided may be, for example, silicon oxide. The insulating layer (not shown) additionally provided may have a smaller thickness than that of each of the insulating materials 112.

Hereinafter, heights of the first conductive materials 211-291, 212-292, and 213-293 will be defined. The first conductive materials 211 to 291, 212-292, and 213-293 may be defined to have first to ninth heights from the substrate 111, sequentially. The first conductive materials 211-213 that may be adjacent to the substrate 111 may have the first height. The first conductive materials 291-293 that may be adjacent to the second conductive materials 331-333 may have the ninth height. The longer the distance between the first conductive material and the substrate 111, the greater the height of the first conductive material.

In FIGS. 3 and 4, each of the pillars 113 may constitute a string together with a region that may be adjacent to the insulating layer 116 and a region that may be adjacent of the first conductive materials 211-291, 212-292 and 213-293. For example, each pillar 113 may constitute a NAND string NS together with a region that may be adjacent to the insulating layer 116 and a region that may be adjacent to the first conductive materials 211-291, 212-292 and 213-293. The NAND string NS may include a plurality of transistor structures TS. A subset of the transistor structures TS in a specific string may be a substring.

Figure 5:
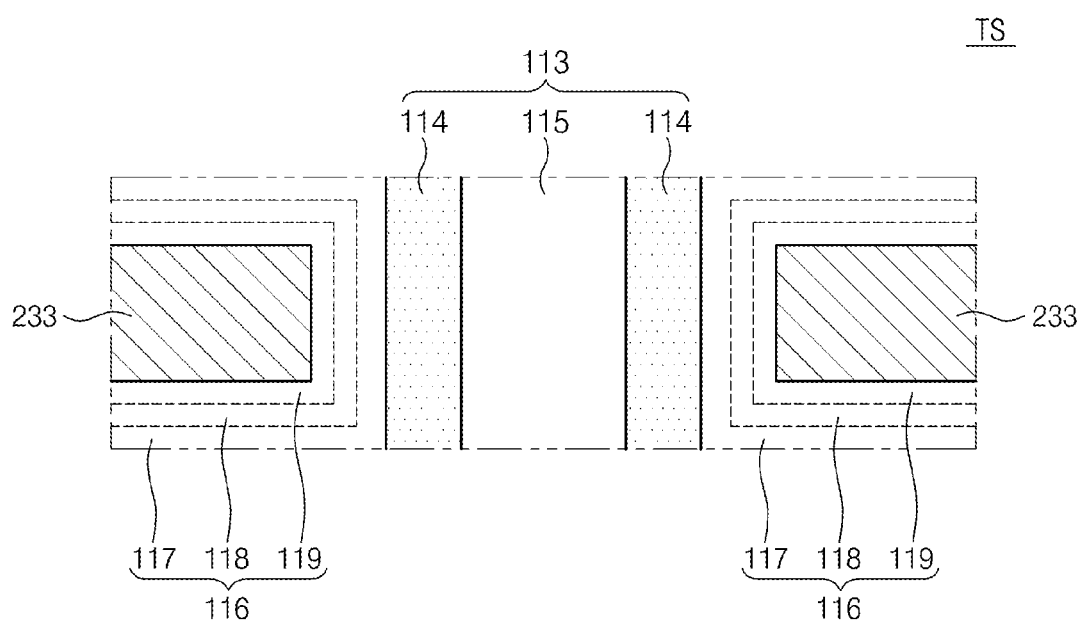

FIG. 5 is a cross-sectional diagram illustrating a transistor structure TS shown in FIG. 4. Referring to FIGS. 3-5, the insulating layer 116 may include first to third sub-insulating layers 117, 118 and 119. Of the pillar 113, the surface layer 114 that may contain p-type silicon may act as a body. The first sub-insulating layer 117 that may be adjacent to the pillar 113 may act as a tunneling insulating layer. For example, the first sub-insulating layer 117 that may be adjacent to the pillar 113 may include a thermal oxide layer. The second sub-insulating layer 118 may act as a charge storage layer. For example, the second sub-insulating layer 118 may act as a charge trap layer. For example, the second sub-insulating layer 118 may include nitride and/or metal oxide.

The third sub-insulating layer 119 that may be adjacent to the first conductive material 233 may act as a blocking insulating layer. The third sub-insulating layer 119 that may be adjacent to the first conductive material 133 and may extend in the first direction may have a single-layer structure or a multi-layer structure. The third sub-insulating layer 119 may be a high-k dielectric layer (e.g., aluminum oxide layer, hafnium oxide layer, etc.) that may have a higher dielectric constant than the first and second sub-insulating layers 117 and 118.

The first conductive material 233 may act as a gate (or control gate). The first conductive material 233 that may act as the gate (or control gate), the third sub-insulating layer 119 that may act as the blocking insulating layer, the second sub-insulating layer 118 that may act as the charge trap layer, the first sub-insulating layer 117 that may act as the tunneling insulating layer, and the surface layer 114 that may contain p-type silicon and may act as the body may constitute a transistor (or memory cell transistor structure). The first to third sub-insulating layers 117-119 may constitute, as examples, an oxide-nitride-oxide (ONO) structure or an oxide-nitride-aluminum (ONA) structure. Of the pillar 113, the surface layer 114 that may contain p-type silicon may be hereinafter referred to as a second-direction body. Angles between the pillar 113, the insulating layer 116, and a top or bottom surface of the first conductive material 233 may be right angles, acute angles or obtuse angles.

In the memory block BLKa, one pillar 113 may correspond to one NAND string NS. The memory block BLKa may include a plurality of pillars 113. The memory block BLKa may include a plurality of NAND strings NS. More specifically, the memory block BLKa may include a plurality of NAND strings NS that may extend in the second direction (or direction perpendicular to the substrate). Each of the NAND strings NS may include a plurality of transistor structures TS that may be stacked in the second direction. At least one of the transistor structures TS of each NAND string NS may act as a string selection transistor SST. At least one of the transistor structures TS of each NAND string may act as a ground selection transistor GST.

The gates (or control gates) that may correspond to the first conductive materials 211-291, 212-292 and 213-293 may extend in the first direction. The gates (or control gates) may extend in the first direction as wordlines and at least two selection lines SL (e.g., at least one string selection line SSL and at least one ground selection line GSL). The second conductive materials 331-333 that may extend in the third direction may be connected to one ends of the NAND strings NS. For example, the second conductive materials 331-333 that may extend in the third direction may act as bitlines BL. In one memory block BLKa, a plurality of NAND strings may be connected to one bitline BL. The second-type doping regions 311-314 that may extend in the first direction may be provided at the other ends of the NAND strings NS. The second-type doping regions 311-314 that may extend in the first direction may act as a common source line CSL.

A memory block BLKa may include a plurality of NAND strings NS that may extend in a direction (second direction) perpendicular to the substrate 111 and may act as a NAND flash memory block (e.g., charge trap type) in which the NAND strings NS may be connected to one bitline BL.

In FIGS. 3-5, while it has been described in at least some of the above example embodiments that the conductive lines 211-291, 212-292 and 213-293 that may extend in the first direction may be provided on nine layers, the above example embodiment is not limited thereto. Conductive lines that may extend in the first direction may be provided on eight layers, sixteen layers or any number of layers. For example, eight, sixteen or a plurality of transistors may exist in one NAND string. The first conductive materials may be provided on a plurality of layers constituting memory cells and at least two layers that may constitute selection transistors. For example, the first conductive materials may be provided on layers constituting dummy memory cells.

In FIGS. 3-5, while it has been described in at least some of the above example embodiments that three NAND strings NS may be connected to one bitline BL, the above example embodiment is not limited thereto. According to example embodiments, m NAND strings NS may be connected to one bitline BL in the memory block BLKa. In this case, the number of the first conductive materials 211-291, 212-292, and 213-293 that may extend in the first direction and the number of doping regions 311-314 that may act as the common source line CSL may be adjusted with the number of NAND strings NS that may be connected to one bitline BL.

In FIGS. 3-5, it has been described in at least some of the above example embodiments that three NAND strings NS may be connected to one of the first conductive materials that may extend in the first direction, the above example embodiments of the inventive concepts are not limited thereto. For example, n NAND strings NS may be connected to one of the first conductive materials. In this case, the number of the bitlines 331-333 may be adjusted with the number of the NAND strings that may be connected to one of the first conductive materials.

A sectional area of the pillar 113 in the first and third directions may become smaller as the pillar 113 comes closer to the substrate 111. For example, the sectional area of the pillar 113 in the first and third directions may vary with process characteristics or errors. The pillar 113 may be formed by filling a hole that may be formed by etching with materials such as a silicon material and an insulating material. The greater the etched depth, the smaller an area of the hole in the first and third directions which may be formed by etching. The sectional area of the pillar 113 in the first and third directions may become smaller as the pillar 113 comes closer to the substrate 111.

Figure 6:
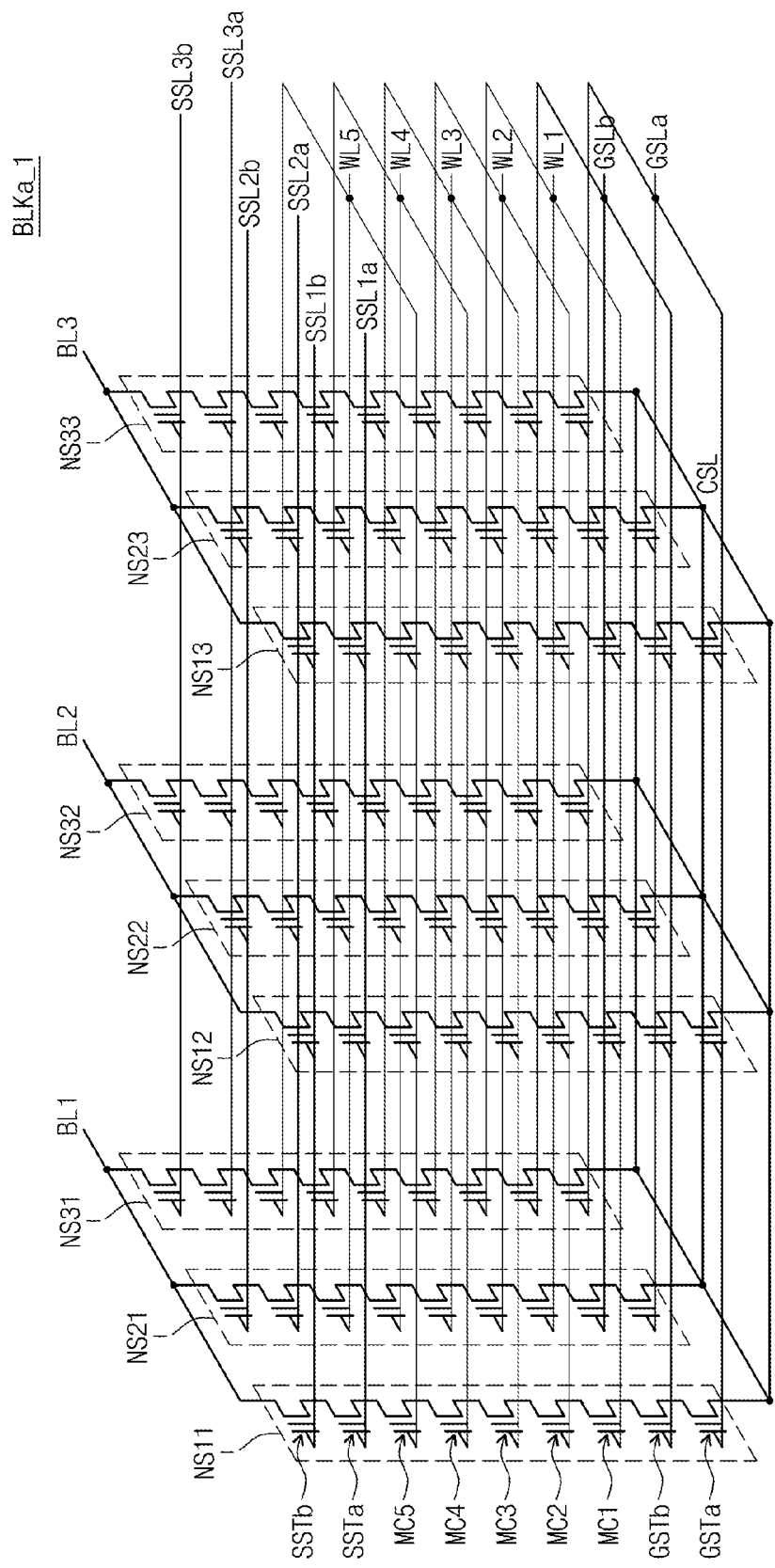

FIG. 6 is a circuit diagram of an equivalent circuit BLKa_1 according to at least one example embodiment of a memory block described with reference to FIGS. 3-5. Referring to FIGS. 3-6, NAND strings NS11, NS21 and NS31 may be between a first bitline BL1 and a common source line CSL. NAND strings NS12, NS22 and NS32 may be between a second bitline BL2 and the common source line CSL. NAND strings NS13, NS23 and NS33 may be between a third bitline BL3 and the common source line CSL. The first to third bitlines BL1-BL3 may correspond to the second conductive materials 331-333 that may extend in the third direction, respectively.

A string selection transistor SST of each NAND string NS may be connected to the corresponding bitline BL. A ground selection transistor GST of each NAND string NS may be connected to the common source line CSL. Memory cells MC may be provided between the string selection transistor SST and the ground selection transistor GST of each NAND string NS. Hereinafter, the NAND strings NS may be defined in units of rows and columns. The NAND strings NS that may be commonly connected to one bitline may constitute one column. For example, the NAND strings NS11-NS31 that may be connected to the first bitline BL1 may correspond to a first column. The NAND strings NS12-NS32 that may be connected to the second bitline BL2 may correspond to a second column. The NAND strings NS13-NS33 that may be connected to the third bitline BL3 may correspond to a third column.

Rows of NAND strings NS may be defined as units of string selection lines SSL. The NAND strings NS11-NS13 that may be connected to the first string select lines SSL1a and SSL1b may constitute a first row. The NAND strings NS21-NS23 that may be connected to the second string select lines SSL2a and SSL2b may constitute a second row. The NAND strings NS31-NS33 that may be connected to the third string select lines SSL3a and SSL3b may constitute a third row.

A height may be defined in each NAND string NS. In each NAND string NS, a height of a lower ground selection transistor GSTa may be defined as 1 and a height of an upper ground selection transistor GSTb may be defined as 2. Heights of memory cells MC1-MC5 may be defined as heights 3-7, respectively. A height of a lower string selection transistor SSTa may be defined as 8, and a height of an upper string selection transistor SSTb may be defined as 9. The NAND strings NS of the same row may be connected to the ground selections line GSLa and GSLb. The NAND strings NS that may be arranged in different rows may share the ground selections line GSLa and GSLb. The first conductive materials 211-213 that may have the first height may be connected to each other to constitute the ground selection line GSLa, and the first conductive materials 221-223 that may have the second height may be connected to each other to constitute a ground selection line GSLb.

The memory cells MC that may have the same height in the NAND strings NS of the same row may share the wordline WL. The wordlines WL of the NAND strings NS which may have the same height and may correspond to different rows may be commonly connected. The memory cells MC with the same height share the wordline WL. The first conductive materials 231-233 that may have the third height may be commonly connected to constitute the first wordline WL1. The first conductive materials 241-243 that may have the fourth height may be commonly connected to constitute the third wordline WL2. The first conductive materials 251-253 that may have the fifth height may be commonly connected to constitute the third wordline WL3. The first conductive materials 261-263 that may have the sixth height may be commonly connected to constitute the fourth wordline WL4, and so on.

The NAND strings NS of the same row may share the lower string selection line SSLa and the upper string selection line SSLb. The NAND strings may be arranged in different rows may be connected to different lower string selection lines SSL1a, SSL2a, and SSL3a and different upper string selection lines SSL1b, SSL2b, and SSL3b, respectively. The first to third lower string selection lines SSL1a-SSL3a may correspond to first conductive materials 281-283 that may have the eighth height, respectively. The first to third upper string selection lines SSL1b, SSL2b, and SSL3b may correspond to the first conductive materials 291-293 that may have the ninth height, respectively.

The common source line CSL may be commonly connected to the NAND strings NS. For example, the first to fourth doping regions 311-314 may be connected to each other to constitute the common source line CSL. The wordlines WL that may have the same height may be commonly connected. When the wordline WL with a specific height may be selected, all the NAND strings NS that may be connected to the selected wordline WL may be selected. The NAND strings of different rows may be connected to different string selection lines SSL. Among the NAND strings NS that may be connected to the same wordline WL, the NAND strings NS of an unselected row may be electrically isolated from the corresponding bitline and the NAND strings NS of a selected row may be electrically connected to the corresponding bitline by selecting and unselecting the string selection lines SSL1a-SSL3a and SSL1b-SSL3b.

The row of the NAND stings NS may be selected by selecting and unselecting the string selection lines SSL1-SSL3. The NAND strings NS of the selected row may be selected in units of columns by selecting the bitlines BL1-BL3. A select voltage may be applied to the selected wordline of the selected row during program and read operations, and an unselect voltage may be applied to the unselected wordline. For example, the select voltage may be a program voltage Vpgm or a read voltage Vr. For instance, the unselect voltage may be a pass voltage Vpass or unselect read voltage Vread. The program and read operations may be performed in units of wordlines of the selected row of the NAND strings NS11-NS13, NS21-NS23 and NS31-NS33.

Among the first conductive materials 211-291, 212-292 and 213-293, thicknesses of the insulating materials 112 that may be between the first conductive material that may be acting as the selection lines and the first conductive material that may be acting as the wordlines may be greater than those of other insulating materials 112. Hereinafter, a bitline that may correspond to a memory cell to be programmed may be referred to as a selected bitline, and a bitline that may correspond to a memory cell so that it may be program-inhibited may be referred to as an unselected bitline. Hereinafter, it may be assumed that first rows of the NAND strings NS11-NS13, NS21-23, and NS31-33 may be selected during a program operation, the second bitline BL2 may be selected during the program operation, and the first and third bitlines BL1 and BL3 may be unselected during the program operation.

Figure 7:
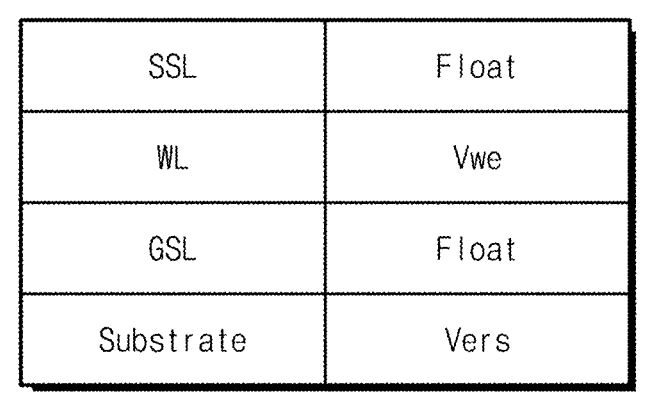

FIG. 7 is a table illustrating at least one example embodiment of a voltage condition during an erase operation of a nonvolatile memory device of FIG. 1. An erase operation may be performed in units of memory blocks. The erase operation will be described below with reference to a memory block BLKa described with reference to FIGS. 3-6. In the erase operation, the string selection lines SSL1a-SSL3a and SSL1b-SSL3b may be floated. A wordline erase voltage Vwe may be applied to wordlines WL1-WL5. For example, the wordline erase voltage Vwe may be a ground voltage Vss. The ground selection lines GSLa and GSLb may be floated. An erase voltage Vers may be applied to a substrate 111.

The substrate 111 and a second-direction body 114 may be made of silicon materials that may have the same conductivity type. The erase voltage Vers that may be applied to the substrate 111 may be transferred to the second-direction body 114. The erase voltage Vers may be a high voltage. The ground selection lines GSLa and GSLb and the string selection lines SSL1a-SSL3a and SSL1b-SSL3b may be in a floating state. When the voltage of the second-direction body 114 is shifted, ground selection lines GSLa and GSLb and the string selection lines SSL1a-SSL3a and SSL1b-SSL3b may be affected by a coupling effect. When the voltage of the second-direction body 114 may rise to the erase voltage Vers, voltages of ground selection lines GSLa and GSLb and the string selection lines SSLa1-SSLa3 and SSLb1-SSLb3 may also rise. A ground selection transistors GST and a string selection transistors SST may be prevented from being erased.

The wordline erase voltage Vwe may be applied to the wordlines WL1-WL5. The wordline erase voltage Vwe may be a low voltage. For example, the wordline erase voltage Vwe may be the ground voltage Vss. Due to a difference in voltage between the second-direction body 114 and the wordlines WL1-WL7, Fowler-Nordheim tunneling may occur in the memory cells MC1-MC5. The memory cells MC1-MC may be erased.

Figure 8:
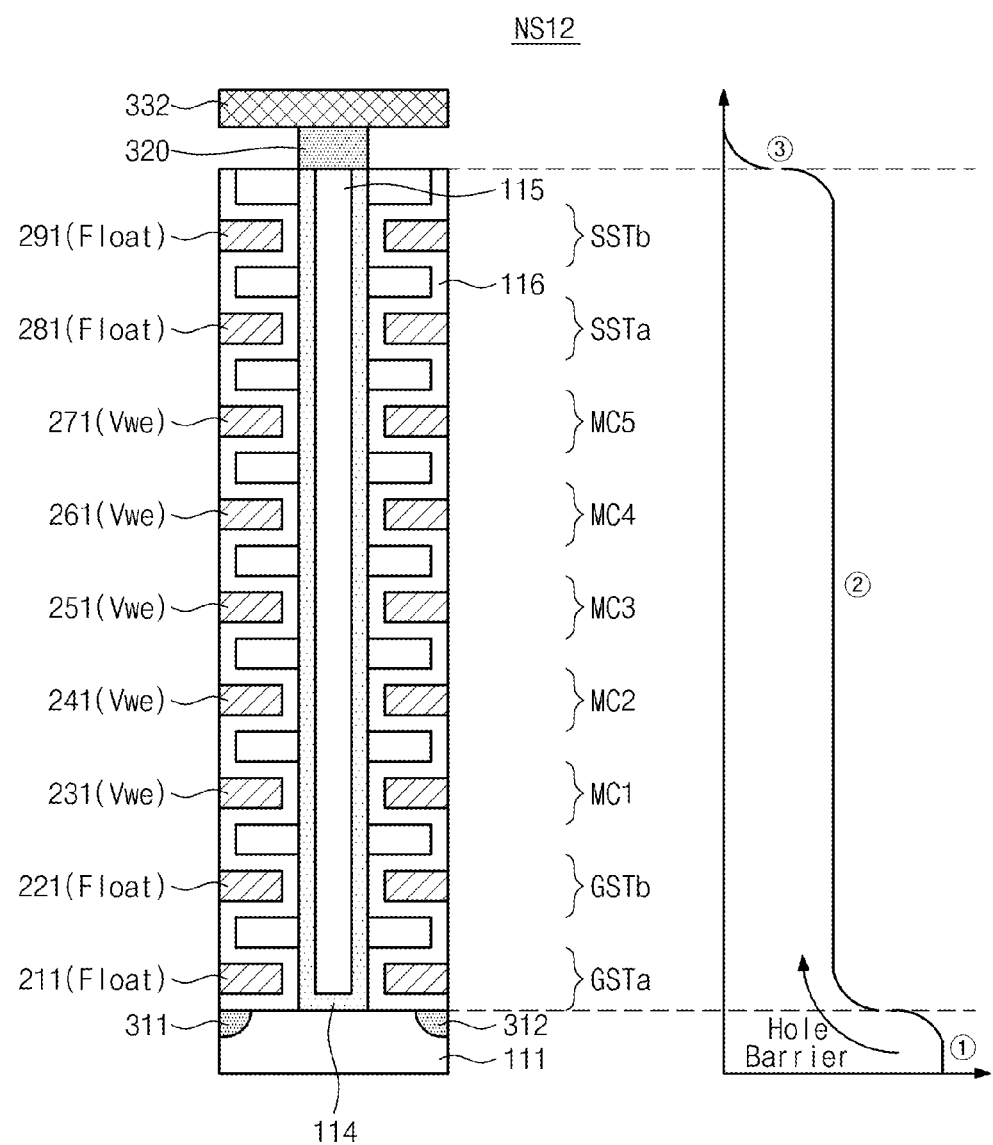

FIG. 8 is a cross-sectional diagram and a band diagram illustrating a NAND string in a memory block described with reference to FIGS. 3-6. FIG. 8 is a cross-sectional diagram showing a band diagram of NS12 of the NAND strings NS11-NS13, NS21-NS23 and NS31-NS33 in the memory block BLKa described with reference to FIGS. 3-6 and a corresponding NAND string. Referring to FIGS. 3-8, the substrate 111 may be p-type silicon. The second-direction body 114 may be intrinsic silicon, p-type silicon that may have a lower doping concentration than the substrate 111 or lightly doped n-type silicon. The band energy (2) of the second-direction body 114 may be lower than the band energy (1) of the substrate 111. For example, the band energy (2) of the second-direction body 114 may be lower than the band energy (1) of the substrate 111 by 0.4 to 0.5 electron volt. A drain 320 may be n-type silicon. The band energy (3) of the drain 320 may be lower than the band energy (2) of the second-direction body 114. Energy barriers may exist between the drain 320 and the second-direction body 114 and between the second-direction body 114 and the substrate 111, respectively.

The major carrier of the substrate 111 may be holes. When an erase voltage Vers is supplied to the substrate 111, it may be supplied to the second-direction body 114 by the holes. The energy barrier between the substrate 111 and the second-direction body 114 may be a hole barrier which blocks voltage transfer by the holes. The erase voltage Vers that may be supplied to the substrate 111 may not be normally transferred to the second-direction body 114. When the erase voltage Vers is supplied to the substrate 111, the first conductive material 211 that may constitute the ground selection line GSL may be floated. When a voltage level of the substrate rises due to the erase voltage Vers, a voltage level of the second conductive material 211 may also rise. The energy barrier between the substrate 111 and the second-direction body 114 may be maintained, and the erase voltage Vers may not be normally supplied to the second-direction body 114. The erase operation may not be normally performed.

According to example embodiments, the nonvolatile memory device may be configured to drive the ground selection lines GSLa and GSLb according to the voltage level of the substrate in the memory cell array 110. When the erase voltage Vers is supplied to the substrate 111, a specific voltage such as a ground voltage Vss may be supplied to the first conductive materials 211 and 221. Because the voltage level of the first conductive materials 211 and 221 may be constantly maintained while the voltage level of the substrate 111 rises, holes may be accumulated between the second-direction body 114 and the substrate 111 to reduce the energy barrier. When the voltage of the substrate 111 reaches a target level, the first conductive materials 211 and 221 may be floated. Because the energy barrier between the second-direction body 114 and the substrate 11 may be reduced, the voltage supplied to the substrate 111 may be normally supplied to the second-direction body 114. When the voltage of the substrate 111 rises, the voltage of the first conductive materials 211 and 221 also may rise. The ground selection transistors GST made of the first conductive materials 211 and 221 may be prevented from being erased.

Figure 9:
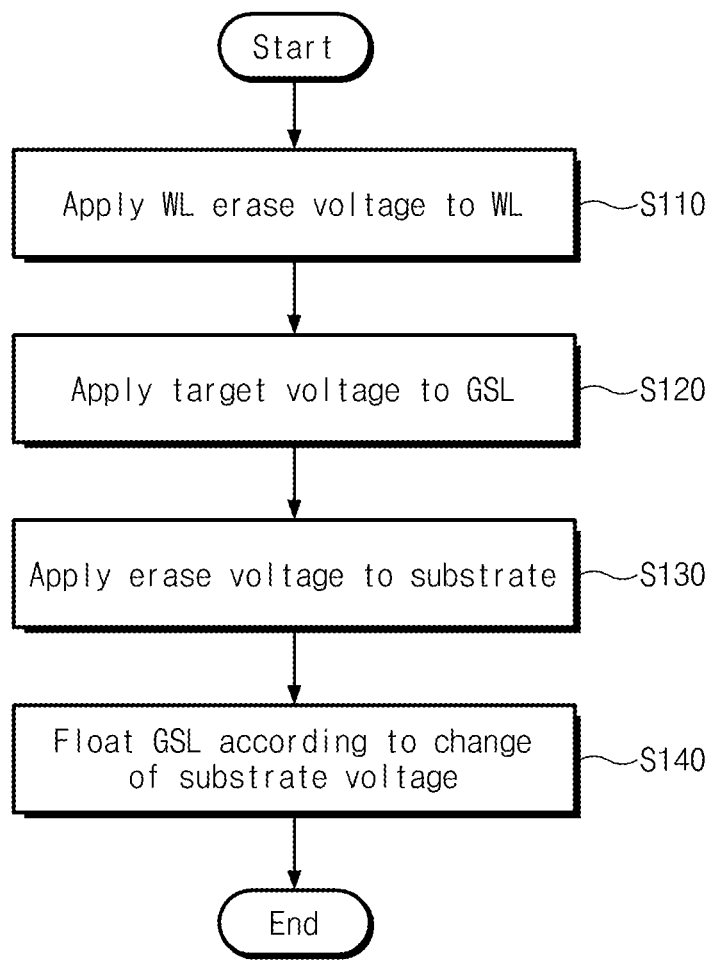

FIG. 9 is a flowchart illustrating erase methods of a nonvolatile memory device of FIG. 1. It may be assumed that among memory blocks BLK1-BLKz in the memory cell array 110, the memory block BLKa described with reference to FIGS. 3-6 is erased. It may be assumed that a block selection circuit 121 in the address decoder 120 selects the memory block BLKa. Referring to FIGS. 1-6 and FIG. 9, at step S110, the wordline erase voltage Vwe may be applied to the wordlines WL1-WL5. For example, the wordline erase voltage Vwe may be a low voltage. For example, the wordline erase voltage Vwe may be the ground voltage Vss. For example, the wordline erase voltage Vwe may have a lower level than the ground voltage Vss. For example, the address decoder 120 may drive the wordlines WL1-WL5 with the wordline erase voltage Vwe.

At step S120, a target voltage may be applied to the ground selection lines GSLa and GSLb. For example, the target voltage may be a voltage for turning off the ground selection transistors GSTa and GSTb. For example, the target voltage may have a lower level than a threshold voltage of the ground selection transistors GSTa and GSTb. For example, the target voltage may be the ground voltage Vss. For example, the target voltage may have a lower level than the ground voltage Vss. For example, the address decoder 120 may drive the ground selection lines GSLa and GSLb with the target voltage. At step S130, the erase voltage Vers may be applied to the substrate 111. For example, the erase voltage Vers may be a high voltage. For example, the substrate bias circuit 160 may supply the erase voltage Vers to the substrate 111.

At step S140, the ground selection line GSL may be floated according to the variation of a substrate voltage. For example, the substrate monitor circuit 130 may monitor the voltage variation of the substrate 111 in the memory cell array 110. Based on the voltage variation of the substrate 111, the substrate monitor circuit 130 may activate or deactivate a ground enable signal GE. In response to the ground enable signal GE, the address decoder 120 may apply the target voltage to the ground selection lines GSLa and GSLb or may float the ground selection lines GSLa and GSLb.

The steps S110-S130 may be performed at the same time. The steps S110 and S100 may be sequentially performed. The steps S110 to S130 may be performed in reverse order. During the steps S110 to S130, the address decoder 120 may control an output value such that the string selection lines SSLa1-SSLa3 and SSLb1-SSLb3 are floated.

FIG. 10 is a table illustrating an erase voltage condition according to an erase method of FIG. 9. Referring to FIGS. 1-6, 9 and 10, the string selection lines SSL1a-SSL3a and SSL1b-SSL3b may be floated during an erase operation. During the erase operation, the wordline erase voltage Vwe may be applied to the wordlines WL1-WL5. When the erase operation is started, a target voltage (e.g., ground voltage Vss) may be applied to the ground selection lines GSLa and GSLb. The ground selection lines GSLa and GSLb may be floated. During the erase operation, the erase voltage Vers may be applied to the substrate 111.

Figure 11:
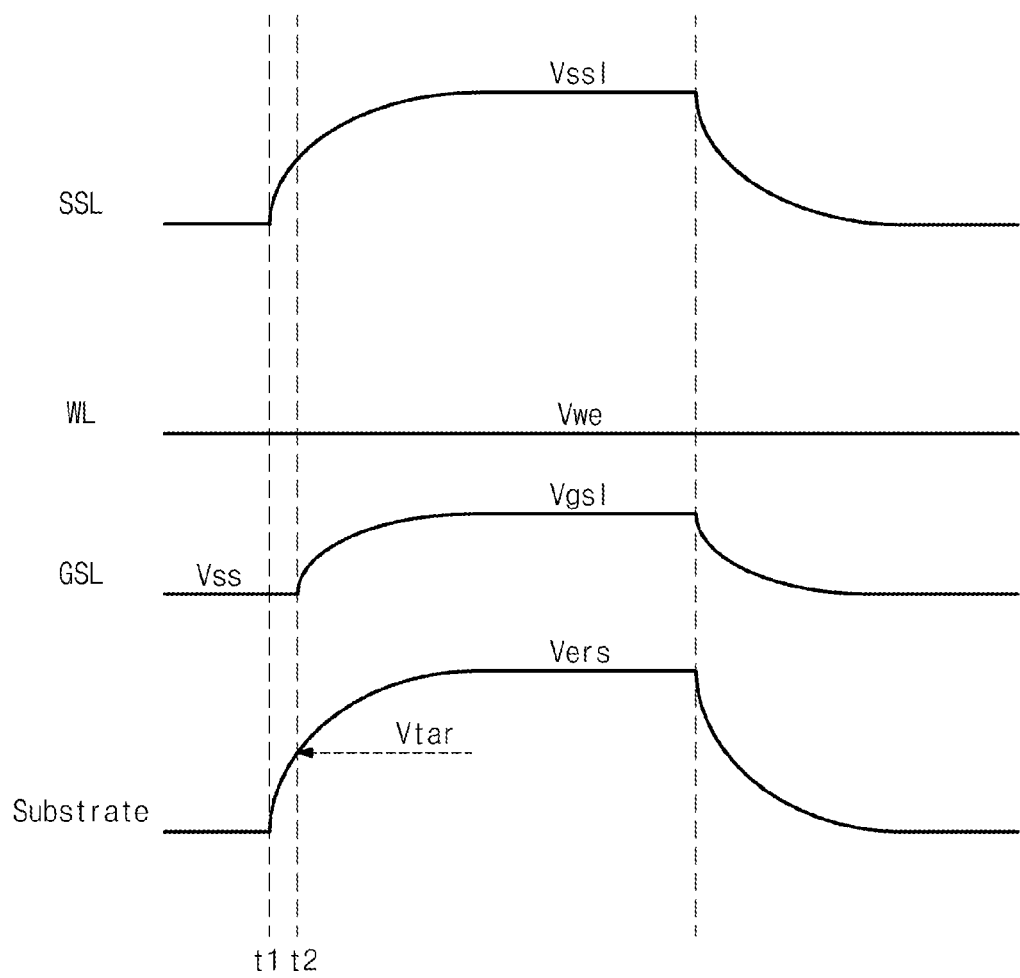

FIG. 11 is a timing diagram illustrating voltage variation of an erase method of FIG. 9 under an erase voltage condition of FIG. 10. Referring to FIGS. 1-6 and 9-11, the erase voltage Vers may be applied to the substrate 111 at a first time t1. The voltage of the substrate 111 may begin to rise at the first time t1. At this point, a target voltage (e.g., ground voltage Vss) may be applied to the ground selection lines GSLa and GSLb. Because the voltage of the ground selection line GSL may be maintained, the energy barrier between the substrate 111 and the second-direction body 114 may be reduced if the voltage of the substrate 111 rises. The voltage of the second-direction body 114 may rise as the voltage if the substrate 111 rises. The wordline voltage Vwe may be applied to the wordlines WL1-WL5.

The string selection lines SSL1a-SSL3a and SSL1b-SSL3b may be in a floating state. If the voltage of the second-direction body 114 rises, the voltages of the string selection lines SSL1a-SSL3a and SSL1b-SSL3b may also rise. At a second time t2, the voltage level of the substrate 111 may reach the level of a target voltage Vtar. At this time t2, the ground selection lines GSLa and GSLb may be floated. For example, the address decoder 120 may float the ground selection lines GSLa and GSLb.

After the second time t2, the voltage of the substrate 111 may rise up to the level of the erase voltage Vers. As the voltage of the substrate 111 may rise, the voltages of the string selection lines SSL1a-SSL3a and SSL1b-SSL3b may also rise. For example, the voltages of the string selection lines SSL1a-SSL3a and SSL1b-SSL3b may rise up to the level of a string selection line voltage Vss1. Because the ground selection lines GSLa and GSLb may be floated at the second time t2, the voltages of the ground selection lines GSLa and GSLb may also rise due to a coupling effect after the second time t2. For example, the voltages of the ground selection lines GSLa and GSLb may rise up to the level of a ground selection line voltage Vgs1.

The voltages of the wordlines WL1-WL5 may be maintained at the level of the wordline erase voltage Vwe during the erase operation. For example, the wordline erase voltage Vwe may be the ground voltage Vss. The voltage of the second-direction body 114 may be an erase voltage Vers, and the voltage of the wordlines WL1-WL5 may be a wordline erase voltage Vwe. Due to a difference in voltage between the second-direction body 114 and the wordlines WL1-WL5, Fowler-Nordheim tunneling may occur in the memory cells MC1-MC5. The memory cells MC1-MC5 may be erased.

The voltage of the second-direction body 114 may be an erase voltage Vers, and the voltage of the string selection lines SSL1-SSL3 may be a string selection line voltage Vss1. A difference in voltage between the second-direction body 114 and the string selection lines SSL1-SSL3 may not be large enough to induce Fowler-Nordheim tunneling. The string selection transistors SST may be prevented from being erased.

The voltage of the second-direction body 114 may be an erase voltage Vers, and the voltage of the ground selection line GSL may be a ground selection line voltage Vgs1. The voltage of the ground selection line GSL may rise after the voltage of the substrate 111 may reach the level of the target voltage Vtar. The level of the ground selection line voltage Vgs1 may be affected by the level of the target voltage Vtar. If the level of the target voltage Vtar may be controlled, the level of the ground selection line voltage Vgs1 may also be controlled.

The level of the target voltage Vtar may be controlled to prevent the difference in voltage between the erase voltage Vers and the ground selection line voltage Vgs1 from possibly inducing the Fowler-Nordheim tunneling and to normally supply voltage to the second-direction body 114 from the substrate 111.

Figure 12:
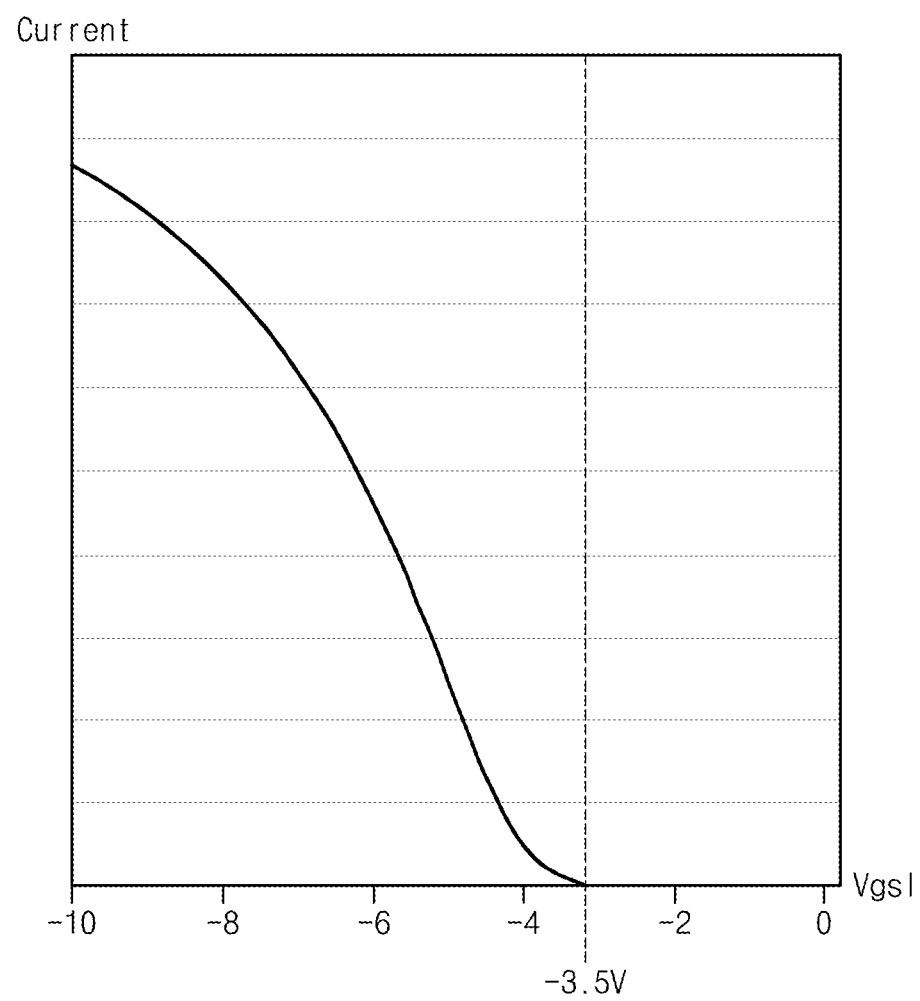

FIG. 12 is a graphic diagram illustrating an amount of current flowing through a second-direction body. In FIG. 12, a horizontal axis may represent a voltage of ground selection lines GSLa and GSLb and a vertical axis may represent the amount of current flowing through the second-direction body 114. Referring to FIGS. 3, 6 and 12, shown may be the amount of current flowing the second-direction body 114 when the voltage of the ground selection lines GSLa and GSLb varies while a ground voltage Vss is applied to the substrate 111, the wordlines WL1-WL5, and the string selection lines SSL1a-SSL3a and SSL1b-SSL3b a and a voltage of about −1.3 volts may be applied to the bitlines BL1-BL3.

Because the voltage of about −1.3 volt may be applied to the bitlines BL1-BL3 and the ground voltage Vss may be applied to the substrate 111, the substrate 111, the second-direction body 114, and the drain 320 may be forward-biased. When the ground selection lines GSLa and GSLb may be the ground voltage Vss (the voltage of the ground selection lines GSLa and GSLb may be equivalent to that of the substrate 111) the current may not flow through the second-direction body 114 due to the energy barrier between the substrate 111 and the second-direction body 114.

As the voltage of the ground selection lines GSLa and GSLb may become lower than that of the substrate 111, the energy barrier between the substrate 111 and the second-direction body 114 may be reduced. When the voltage of the ground selection lines GSLa and GSLb is about −3.5 volt (the voltage of the ground selection lines GSLa and GSLb may be lower than that of the substrate 111 by about 3.5 volt) the current may start to flow through the second-direction body 114. The voltage of the ground selection lines GSLa and GSLb must be lower than that of the substrate 111 by about 3.5 volts or more to sufficiently reduce the energy barrier between the second-direction body 114 and the substrate 111. The current may flow through the second-direction body 114.

A minimum value of a difference in voltage between the substrate 111 and the ground selection lines GSLa and GSLb may be about 3.5 volt. The minimum value of a target voltage Vtar may be about 3.5 volt.

Figure 13:
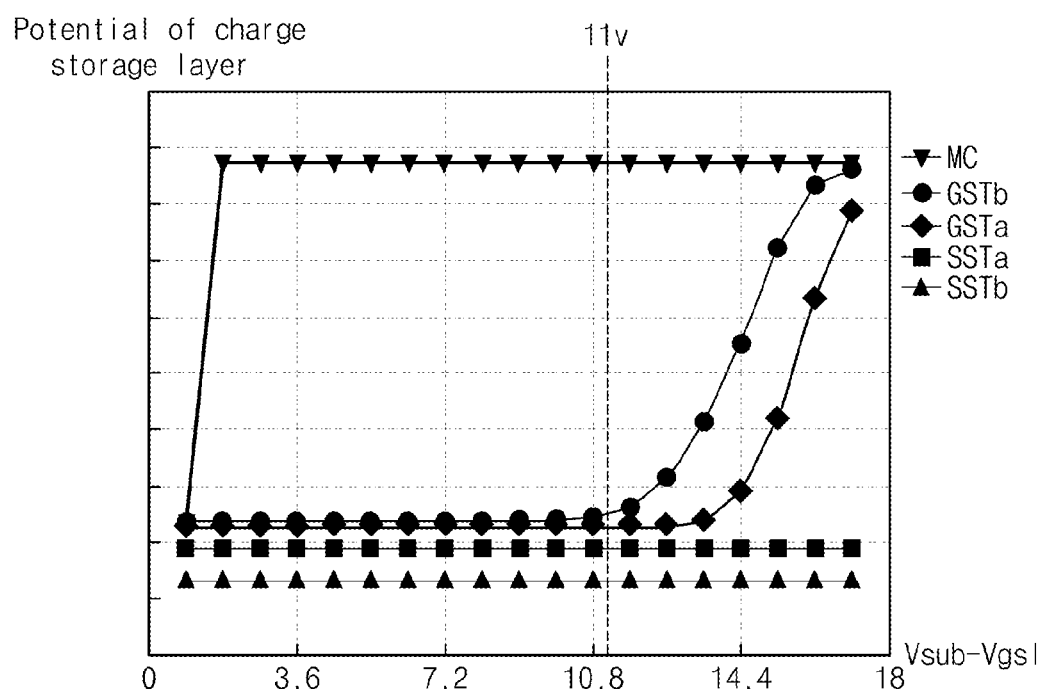

FIG. 13 is a graphic diagram illustrating threshold voltage variation of memory cells, ground selection transistors, and string selection transistors when an erase operation according to at least one example embodiment of the inventive concepts is performed. Referring to FIG. 13, horizontal axis may represent a difference between a substrate voltage Vsub and a ground selection line voltage Vgs1 and a vertical axis may represent potentials of charge storage layers of string selection transistors SSTa and SSTb, memory cells MC, and ground selection transistors GSTa and GSTb. The vertical axis may correspond to threshold voltages of the string selection transistors SSTa and SSTb, the memory cells MC, and the ground selection transistors GSTa and GSTb. Voltages of the horizontal axis may be the substrate voltage Vsub when the ground selection lines GSLa and GSLb may be floated (may be a target voltage Vtar). FIG. 13 may illustrate the variation of threshold voltages of the string selection transistors SSTa and SSTb, the memory cells MC, and the ground selection transistors GSTa and GSTb according to the variation of the target voltage Vtar during an erase operation.

If the level of the target voltage may be lower than a specific level, the potentials of the charge storage layers of the memory cells MC may not vary. The memory cells MC may not be normally erased when the level of the target voltage Vtar may be lower than the specific level. If the level of the target voltage Vtar rises to reach 11 volts, potentials of charge storage layers of upper ground selection transistors GSTb may rise. If the level of the target voltage Vtar rises to reach 11 volt, the upper ground selection transistors GSTb may start to be erased. Lower ground selection transistors GSTa may start to be erased when the target voltage Vtar rises.

As the target voltage Vtar rises, a coupling effect on the ground selection lines GSLa and GSLb may be reduced. A coupling effect on the upper ground selection transistors GSTb from the substrate 111 may be smaller than that on the lower ground selection transistors GSTa from the substrate 111. The level rising due to coupling after the upper ground selection line GSLb may be floated may be lower than the level rising due to coupling after the lower ground selection transistor GSLa is floated. If the target voltage Vtar rises, the upper ground selection transistors GSTb may be erased ahead of the lower ground selection transistors GSTa.

The maximum value of a target voltage Vtar where the ground selection transistors GSTa and GSTb are not erased may be about 11 volt. If the target voltage Vtar may be set to a range between about 3.5 volts and about 11 volts, the memory cells MC may be normally erased while the ground selection transistors GSTa and GSTb may not be erased.

Figure 14:
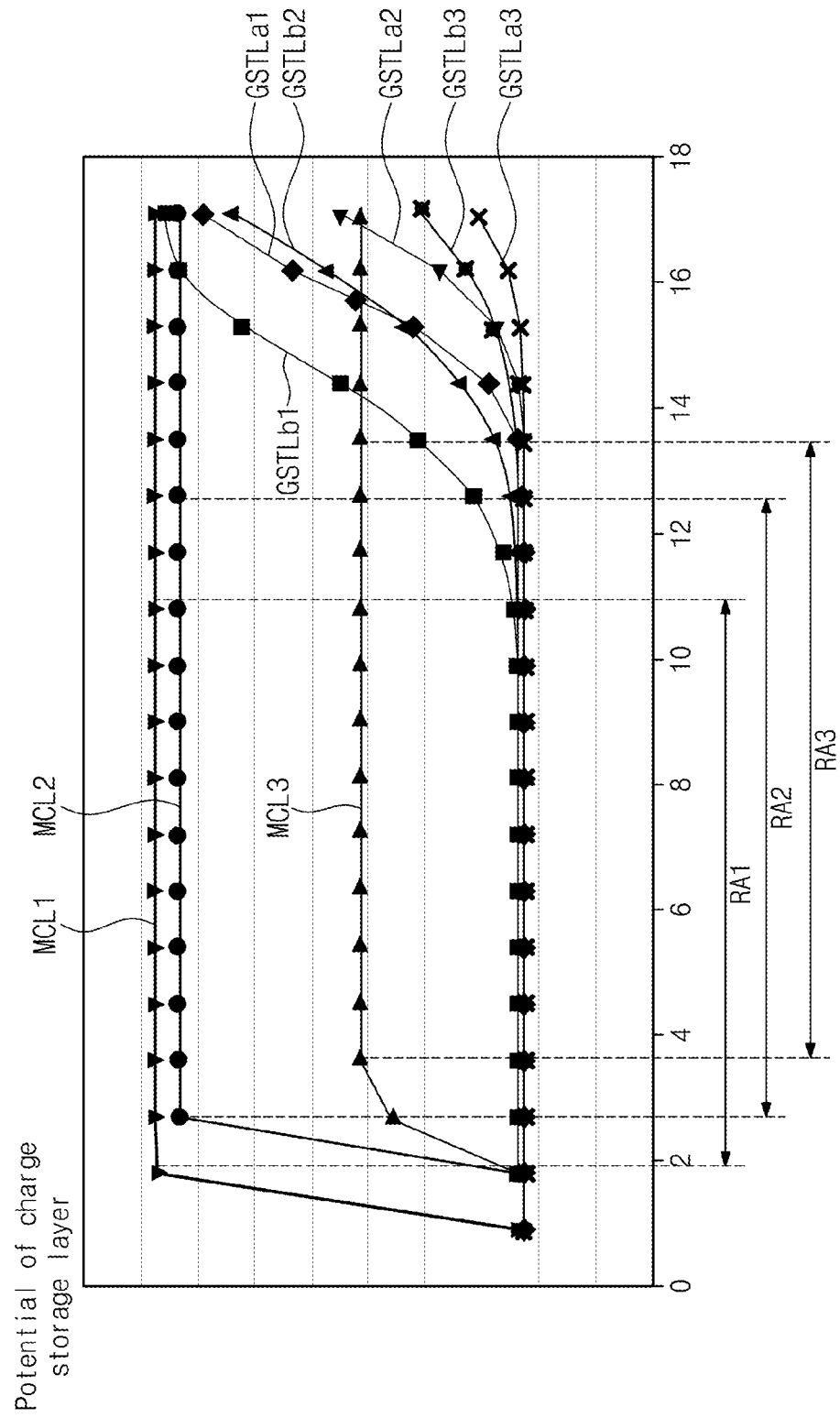

FIG. 14 is a graphic diagram illustrating change in a target voltage range according to rise time and applying time of an erase voltage. A horizontal axis may represent a difference between a substrate voltage Vsub and a ground selection line voltage Vgs1 and a vertical axis may represent potentials of charge storage layers of string selection transistors SSTa and SSTb, memory cells MC, and ground selection transistors GSTa and GSTb. The vertical axis may correspond to threshold voltages of the string selection transistors SSTa and SSTb, the memory cells MC, and the ground selection transistors GSTa and GSTb. Voltages of the horizontal axis may be a substrate voltage Vsub when the ground selection lines GSLa and GSLb may be floated (a target voltage Vtar). FIG. 14 may be the variation of threshold voltages of the string selection transistors SSTa and SSTb, the memory cells MC, and the ground selection transistors GSTa and GSTb according to the variation of the target voltage Vtar during an erase operation.

A first memory cell line MCL1, a first upper ground selection transistor line GSTLb1, and a first lower ground selection transistor line GSTLa1 may exhibit the variation of threshold voltages of the memory cells MC, the upper ground selection transistors GSTb, and the lower ground selection transistors GSTa when a rising time of the erase voltage Vers may be about 1,000 microseconds and a voltage applying time may be about 10,000 microseconds. A range of the target voltage Vtar may be a first range RA1. A second memory cell line MCL2, a second upper ground selection transistor line GSTLb2, and a second lower ground selection transistor line GSTLa2 may exhibit the variation of threshold voltages of the memory cells MC, the upper ground selection transistors GSTb, and the lower ground selection transistors GSTa when a rising time of the erase voltage Vers may be about 100 microseconds and a voltage applying time may be about 1,000 microseconds. The range of the target voltage Vtar may be a second range RA2.

A third memory cell line MCL3, a third upper ground selection transistor line GSTLb3, and a third lower ground selection transistor line GSTLa3 may exhibit the variation of threshold voltages of the memory cells MC, the upper ground selection transistors GSTb, and the lower ground selection transistors GSTa when a rising time of the erase voltage Vers may be about 10 microseconds and a voltage applying time may be about 100 microseconds. The range of the target voltage Vtar may be a third range RA3. The minimum value and the maximum value of the target voltage Vtar may increase with the decrease in rising time and applying time of the erase voltage Vers.

A rising gradient of the erase voltage Vers may decrease with the increase in rising time of the erase voltage Vers. Reduction time of the energy barrier between the substrate 111 and the second-direction body 114 may increase with the decrease in rising gradient of the erase voltage Vers. The minimum value of the target voltage Vtar may increase with the increase in the rising time of the erase voltage Vers.

Similarly, as the rising gradient of the erase voltage Vers may decrease, a voltage of the substrate 111 may reach the level of the erase voltage Vers before the energy barrier between the substrate 111 and the second-direction body 114 may be sufficiently reduced. If the voltage of the substrate 111 may reach the level of the erase voltage Vers before the energy barrier between the substrate 111 and the second-direction body 114 may be sufficiently reduced, the voltage of the second-direction body 114 may be lower than the erase voltage Vers. If the voltage of the second-direction body 114 may be lower than the erase voltage Vers, the memory cells MC may not be sufficiently erased. The substrate 111 where the ground selection transistors GSTa and GSTb are erased may increase in voltage level. The range of the target voltage Vtar may vary with the rising time and the applying time of the erase voltage Vers.

According to at least one erase method according to example embodiments, the voltage of the ground selection line GSL may be controlled according to the voltage level of the substrate 111. When an erase operation is started, the voltage of the ground selection line GSL may be maintained at a target voltage. The target voltage may be a voltage for turning off the ground selection transistor GST. When the voltage level of the substrate 111 reaches the level of the target voltage Vtar, the ground selection line GSL may be floated. Erase disturbance of the memory cells MC1-MC7 may be prevented and the ground selection transistors GST may be prevented from being erased. Reliability of the non-volatile memory device 100 may be enhanced.

Figure 15:
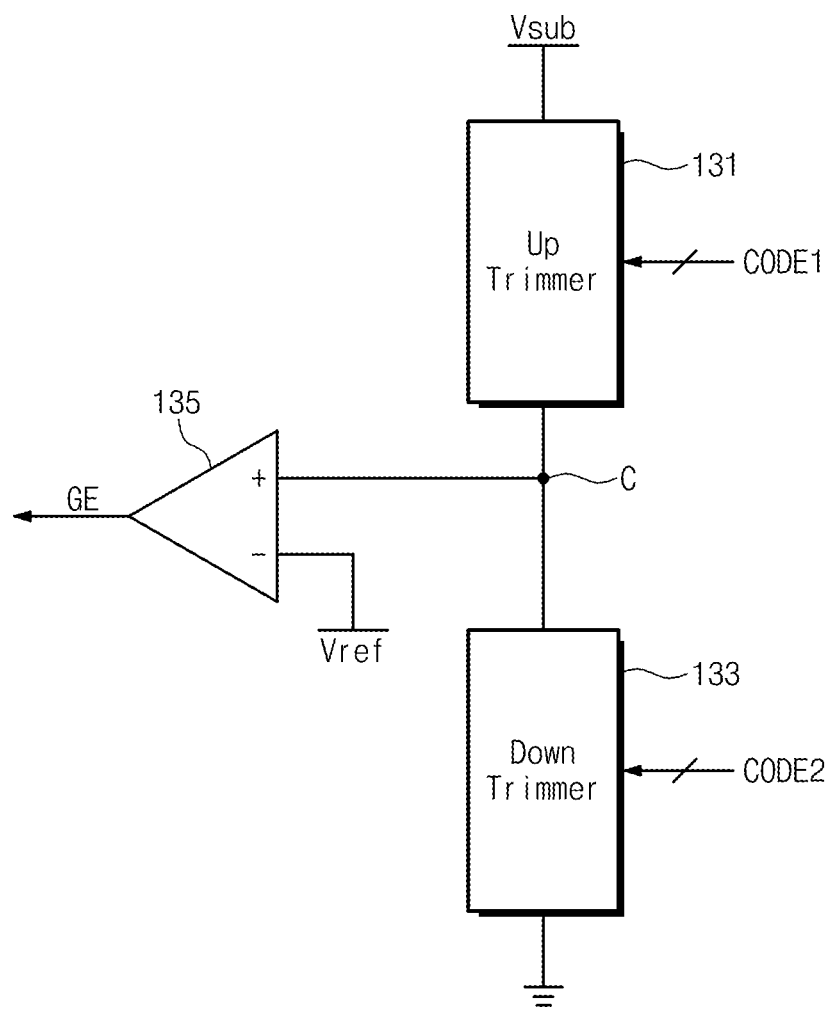

FIG. 15 is a block diagram illustrating a substrate monitor circuit of FIG. 1. Referring to FIG. 15, the substrate monitor circuit 130 may include an up-trimmer 131, a down-trimmer 133 and a comparator 135. A substrate voltage Vsub may be supplied to the up-trimmer 131. The down-trimmer 133 may be connected to a ground terminal. An intermediate node C between the up-trimmer 131 and the down-trimmer 133 may be connected to the comparator 135. The up-trimmer 131 and the down-trimmer 133 may divide the substrate voltage Vsub. For example, the up-trimmer 131 and the down-trimmer 133 may be configured to have resistance values. The substrate voltage Vsub that may be divided by the up-trimmer 131 and the down-trimmer 133 may be supplied to the comparator 135.

The up-trimmer 131 and the down-trimmer 133 may be configured to have variable resistance values. For example, the up-trimmer 131 may control a resistance value in response to a first code signal CODE1. The down-trimmer 133 may control a resistance value in response to a second code signal CODE2. The comparator 135 may compare a voltage of the intermediate node C and a reference voltage Vref. The comparator 135 may activate or deactivate a ground enable signal GE according to a result of the comparison. The ground enable signal GE may be transferred to an address decoder 120. The address decoder 120 may drive a ground selection line GSL of a selected memory block (e.g., BLKa) in response to the ground enable signal GE. For example, as described with reference to FIGS. 9-11, the address decoder 120 may drive the ground selection line GSL. The level of a target voltage Vtar may be set according to a division ratio of the up-trimmer 131 and down-trimmer 133 and the level of the reference voltage Vref.

The division ratio of the up-trimmer 131 and down-trimmer 133 may be controlled by the code signals CODE1 and CODE2. The level of the target voltage Vtar may vary with the code signals CODE1 and CODE2. The code signals CODE1 and CODE2 may be previously stored in a control logic 150. The control logic 150 may output the code signals CODE1 and CODE2 to the substrate monitor circuit 130. In FIG. 15, it has been described that the output of the comparator 135 may be provided as the ground enable signal GE. However, a logic block (not shown) may be additionally provided which may control the output of the comparator 135 and may output the controlled output as the ground enable signal GE.

Figure 16:
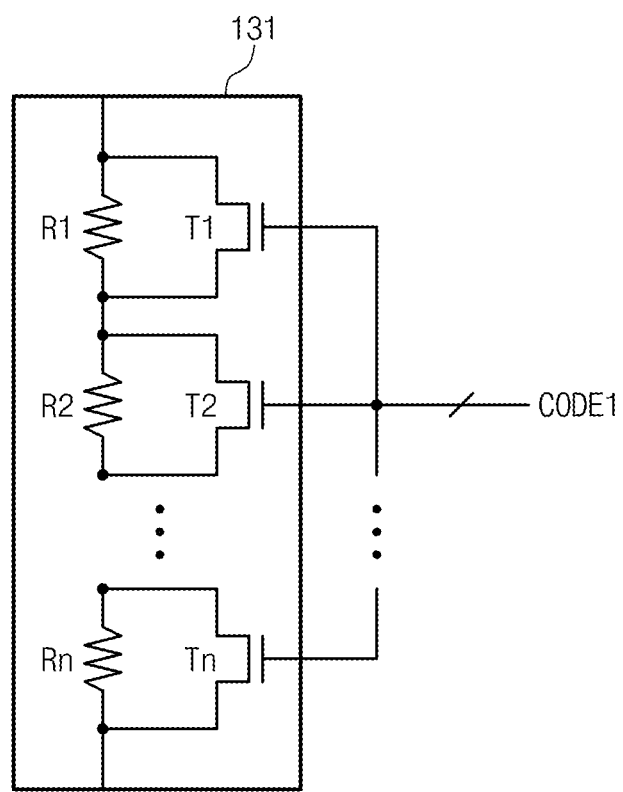

FIG. 16 is a circuit diagram illustrating an up-trimmer of FIG. 15. As illustrated, the up-trimmer 131 may include first to nth resistors R1-Rn and first to nth switches T1-Tn. Although the first to nth switches T1-Tn may be shown as transistors, they are not limited to transistors. The first to nth resistors R1-Rn may be connected in series. The first to nth resistors R1-Rn and the first to nth transistors T1-Tn may be connected in parallel, respectively. The first to nth transistors T1-Tn may operate in response to the first code signal CODE1. When the first transistor T1 may be turned on, a path bypassing the first resistor R1 may be provided by the first transistor T1. A resistance value of the up-trimmer 131 may decrease. If the first transistor T1 is turned off, the path bypassing the first resistor R1 may not be provided. The resistance value of the first resistor R1 may be reflected in that of the up-trimmer 131.

Except that the second code signal CODE2 may be provided, the down-trimmer 133 in FIG. 12 may be configured with the same structure as the up-trimmer 131. The down-trimmer 133 will not be described in further detail. As described above, the resistance value of the up-trimmer 131 may be adjusted by performing control based on the first code signal CODE1. The resistance value of the down-trimmer 133 may be adjusted by controlling the second code signal CODE2. The level of the target voltage Vtar may be varied by controlling the first and second code signals CODE1 and CODE2.

Figure 17A:
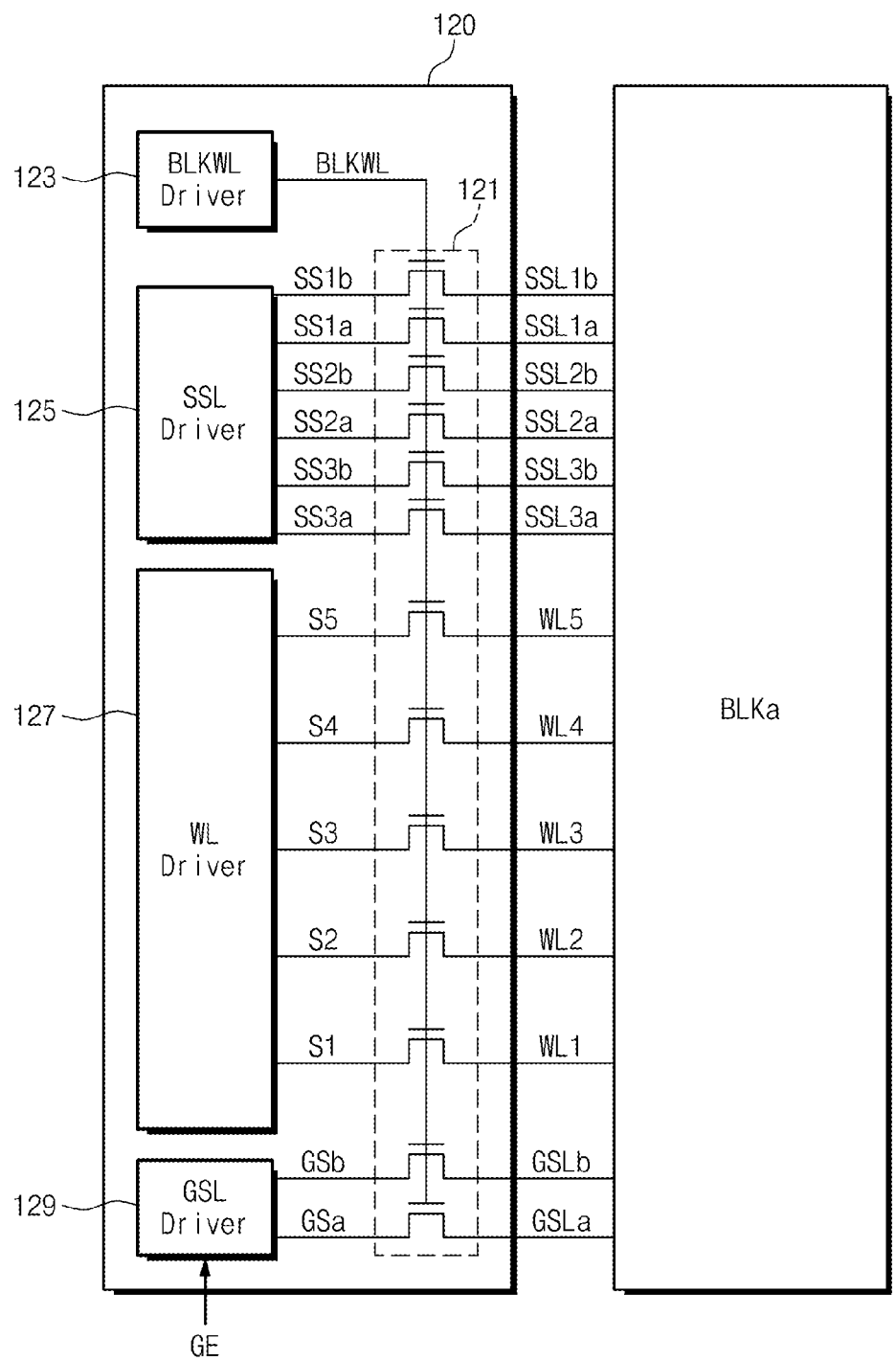
FIG. 17A is a block diagram illustrating a memory cell array and an address decoder in a nonvolatile memory device of FIG. 1.

FIG. 17A is a block diagram illustrating a memory cell array and an address decoder in a nonvolatile memory device of FIG. 1. A memory block BLKa of the memory cell array 110 may be shown. Referring to FIG. 17A, the address decoder 120 may include a block selection circuit 121, a block wordline driver 123, a string selection line driver 125, a wordline driver 12, and a ground selection line driver 129. The block selection circuit 121 may be configured to select one of the memory blocks BLK1-BLKz. The block selection circuit 121 may include a plurality of switches. The block selection circuit 121 may include a plurality of transistors. The block selection circuit 121 may include a plurality of high voltage transistors.

Gates of the transistors of the block selection circuit 121 may be commonly connected to a block wordline BLKWL. Some of the transistors of the block selection circuit 121 may be coupled between string selection lines SSL1a-SSL3a and SSL1b-SSL3b and selection lines SS1a-SS3a and SS1b-SS3b, respectively. Some of the transistors of the block selection circuit 121 may be coupled between wordlines WL1-WL5 and selection lines S1-S5, respectively. Some of the transistors of the switch 121 circuit may be coupled between ground selection lines GSLa and GSLb and selection line GSa and GSb. That is, the block selection circuit 121 may connect the string selection lines SSLa1-SSLa3 and SSLb1-SSLb3, the wordlines WL1-WL5, and the ground selection line GSLa and GSLb to the string selection line driver 125, the wordline driver 127, and the ground selection line driver 129 in response to the voltage level of the block wordline BLKWL, respectively.

The block wordline driver 123 may be configured to drive the block wordline BLKWL. For example, if a memory block BLKa is selected, the block wordline driver 123 may apply a selection voltage to the block wordline BLKWL. The block wordline driver 123 may apply a high voltage Vpp to the block wordline BLKWL during a program operation and a read operation. The block wordline driver 123 may apply a power supply voltage Vcc to the block wordline BLKWL during an erase operation.

The string selection line driver 125 may be connected to selection lines SSa1-SS3 and SSb1-SSb3. The selection lines SS1a-SS3a and SSb1b-SS3b may be connected to the string selection lines SSL1a-SSL3a and SSL1b-SSL3b through the block selection circuit 121. The string selection line driver 125 may be configured to drive the string selection lines SSL1a-SSL3a and SSL1b-SSL3b through the block selection circuit 121. For example, the string selection line driver 125 may be configured to float the string selection lines SSL1a-SSL3a and SSL1b-SSL3b during the erase operation. The wordline driver 127 may be connected to selection lines S1-S5. The selection lines S1-S5 may be connected to the wordlines WL1-WL5 through the block selection circuit 121, respectively. The wordline driver 127 may be configured to drive the wordlines WL1-WL5 through the block selection circuit 121. The wordline driver 127 may be configured to apply a wordline erase voltage Vwe to the wordlines WL1-WL5 during the erase operation.

The ground selection line driver 129 may be connected to selection lines GSa and GSb. The selection line GSa and GSb may be connected to the ground selection lines GSLa and GSLb through the block selection circuit 121. The ground selection line driver 129 may be configured to drive the ground selection lines GSLa and GSLb through the block selection circuit 121. During the erase operation, the ground selection line driver 129 may be configured to operate in response to a ground enable signal GE. When the erase operation is started, the ground selection line driver 129 may be configured to apply a target voltage (e.g., ground voltage Vss) to the ground selection lines GSLa and GSLb. The target voltage may be a voltage for turning off the ground selection transistors GSTa and GSTb. When a logic value of the ground enable signal GE transitions, the ground selection line driver 129 may be configured to float the ground selection lines GSLa and GSLb.

For example, if the ground enable signal GE transitions, the ground selection line driver 129 may control an output to float the ground selection line GSL. For example, the ground selection line driver 129 may output a voltage that may have the same level as the voltage level of the block wordline BLKWL. For example, when the power supply voltage Vcc may be applied to the block wordline BLKWL during an erase operation, the ground selection line driver 129 may output the power supply voltage Vcc in compliance with the transition of the ground enable signal GE. The gate voltage and drain (or source) voltage of the block selection circuit 121 that may correspond to the ground selection lines GSLa and GSLb may become equivalent to each other. The transistor of the block selection circuit 121 corresponding to the ground selection lines GSLa and GSLb may be turned off. The ground selection lines GSLa and GSLb may be floated.

It is not limited that the ground selection line driver 129 may output a voltage that may have the same level as the voltage level of the block wordline BLKWL if the ground enable signal GE may transition. Also, it is not limited that the ground selection line driver 129 may output the power supply voltage Vcc if the ground enable signal GE may transition. The ground selection line driver 129 may be configured to output a voltage for turning off a transistor of the block selection circuit 121 that may be corresponding to the ground selection line GSL when the ground enable signal GE transitions. The ground selection line driver 129 may be configured to float an output node if the ground enable signal GE transitions.

A nonvolatile memory device 100 according to example embodiments may be configured to drive the ground selection lines GSLa and GSLb according to the variation of a substrate voltage of the memory cell array 110 during an erase operation. Erase disturbance of the memory cells MC1-MC5 may be prevented, and the ground selection transistors GSTa and GSTb may be prevented from being erased. Reliability of the nonvolatile memory device 100 may be enhanced.

A nonvolatile memory device 100 according to at least one example embodiment may include a block selection circuit 121, a block wordline driver 123, a string selection line driver 125, a wordline driver 127, and a ground selection line driver 129 which each may correspond to each memory block BLKa of the memory cell array 110. The nonvolatile memory device 100 may drive the ground selection lines GSLa and GSLb according to the variation of the substrate voltage of the memory cell array 110 during erase operation. Erase disturbance of the memory cells MC1-MC5 may be prevented, and the ground selection transistors GSTa and GSTb may be prevented from being erased. Reliability of the nonvolatile memory device 100 may be enhanced.

Figure 17B:
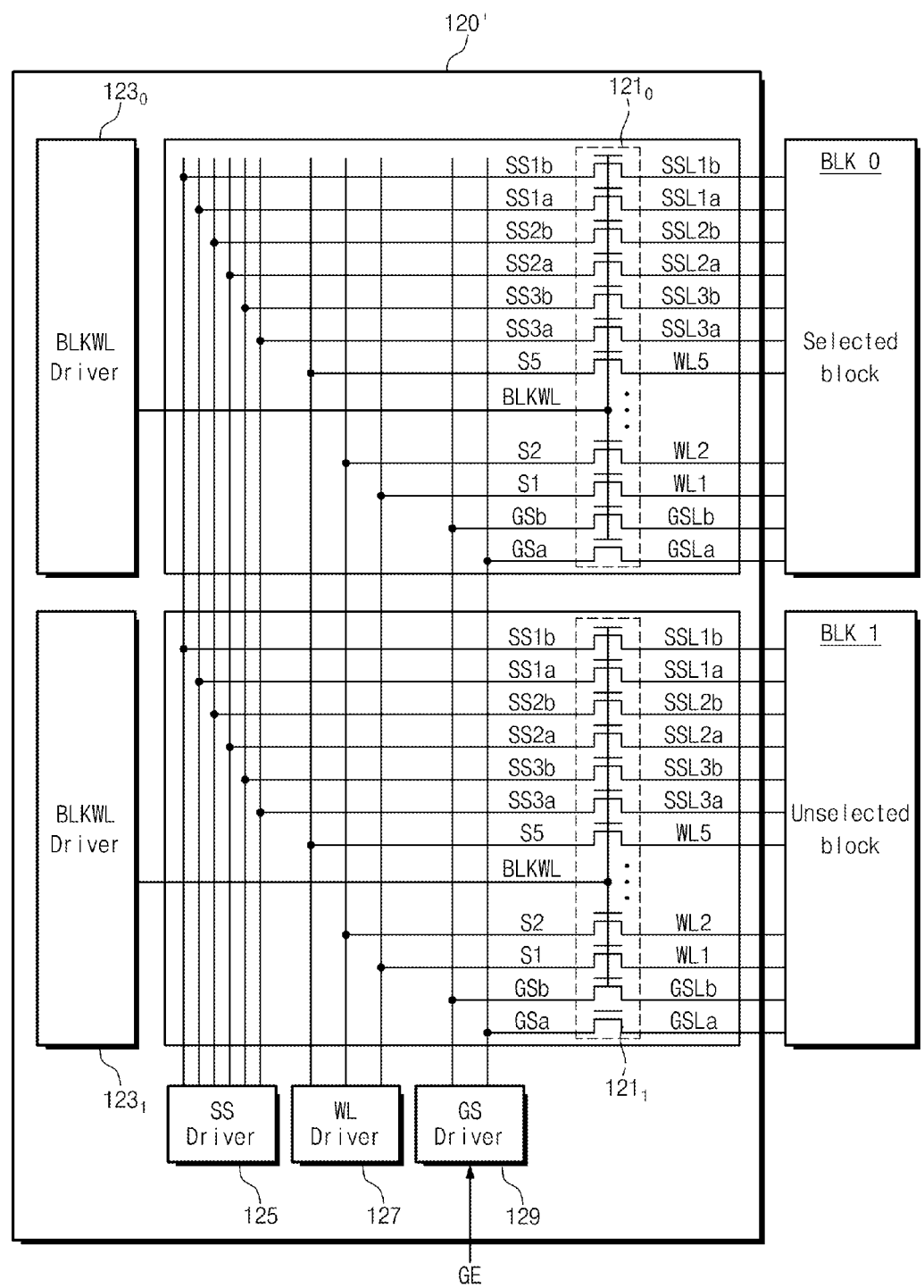
FIG. 17B is a block diagram illustrating other examples of a memory cell array and an address decoder in a nonvolatile memory device of FIG. 1.

FIG. 17B is a block diagram illustrating other examples of a memory cell array and an address decoder in a nonvolatile memory device of FIG. 1. Memory blocks BLK0 and BLK1 of the memory cell array 110 are shown. Referring to FIG. 17B, unlike the address decoder 120 shown in FIG. 17A, an address decoder 120' may include block selection circuit $121_0$ and $121_1$ and block wordline drivers $123_0$ and $123_1$ which may respectively correspond to memory blocks BLK0 and BLK1, and a string selection line driver 125, a wordline driver 127, and a ground selection line driver 129 which may respectively correspond to the memory blocks BLK0 and BLK1.

The n block selection circuits $121_n$ may transfer voltages from the strings selection line driver 125, the wordline driver 127, and the ground selection line driver 129 in response to a block wordline signal BLKWL that may be transferred from a corresponding block wordline driver $123_n$. The block selection circuits $121_n$ may include a plurality of switches. The block selection circuit $121_n$ may include a plurality of transistors. The block selection circuits $121_n$ may include a plurality of high voltage transistors.

Gates of the transistors of the block selection circuits $121_n$ may be commonly connected to a block wordline BLKWL. Some of the transistors of the block selection circuit $121_n$ may be coupled between the string selection lines SSL1a-SSL3a and SSL1b-SSL3b and selection lines SS1a-553a and SS1b-553b, respectively. Some of the transistors of the block selection circuit $121_n$ may be coupled between the wordlines WL1-WL5 and the selection lines S1-S5, respectively. Some of the transistors of the block selection circuit $121_n$ may be coupled between the ground selection lines GSLa and GSLb and selection lines GSa and GSb. That is, the block selection circuit $121_n$ may connect the string selection lines SSL1a-SSL3a and SSL1b-SSL3b, the wordlines WL1-WL5, and the ground selection lines GSLa and GSLb to the string selection line driver 125, the wordline driver 127, and the ground selection line driver 129 in response to the voltage level of the block wordline BLKWL, respectively.

The block wordline driver $123_n$ may be configured to drive the block wordline BLKWL. For example, if a memory block BLK0 may be selected, a block wordline driver $123_0$ may apply a selection voltage to the block wordline BLKWL. The block wordline driver $123_0$ may apply a high voltage Vpp to the block wordline BLKWL during a program operation and a read operation. The block wordline driver $123_0$ may apply a power supply voltage Vcc to the block wordline BLKWL during an erase operation.

The wordline driver 127 may be connected to selection lines S1-S5. The selection lines S1-S5 may be connected to the wordlines WL1-WL5 through the block selection circuit $121_n$. The wordline driver 127 may drive the wordlines WL1-WL5 through the block selection circuit $121_n$. The wordline driver 127 may be configured to apply a wordline erase voltage Vwe to the wordlines WL1-WL5 during the erase operation. The ground selection line driver 129 may be connected to selection lines GSa and GSb. The selection lines GSa and GSb may be connected to the ground selection lines GSLa and GSLb through the block selection circuit $121_n$. The ground selection line driver 129 may be configured to drive the ground selection lines GSLa and GSLb through the block selection circuit $121_n$.

During an erase operation, the ground selection line driver 129 may operate in response to a ground enable signal GE. When the erase operation is started, the ground selection line driver 129 may apply a target voltage (e.g., ground voltage Vss) to the ground selection lines GSLa and GSLb. The target voltage may be a voltage for turning off ground selection transistors GST that may be connected to the ground selection lines GSLa and GSLb. The ground selection line driver 129 may be configured to float the ground selection lines GSLa and GSLb when a logical value of the ground enable signal GE transitions.

For example, if the ground enable signal GE may transition, the ground selection line driver 129 may control an output to float the ground selection line GSL. For example, the ground selection line driver 129 may output a voltage that may have the same level as the voltage level of the block wordline BLKWL. For example, when the power supply voltage Vcc may be applied to the block wordline BLKWL during the erase operation, the ground selection line driver 129 may output the power supply voltage Vcc in compliance with the transition of the ground enable signal GE. The gate voltage and drain (or source) voltage of the block selection circuit 121 that may be corresponding to the ground selection lines GSLa and GSLb may become equivalent to each other. A transistor of the block selection circuit 121 that may be corresponding to the ground selection lines GSLa and GSLb may be turned off. Ground selection lines GSL0 and GSL1 may be floated.

It is not limited that the ground selection line driver 129 outputs a voltage that may have the same level as the voltage level of the block wordline BLKWL if the ground enable signal GE may transition. Also, it is not limited that the ground selection line driver 129 may output the power supply voltage Vcc if the ground enable signal GE may transition. The ground selection line driver 129 may be configured to output a voltage for turning off the transistor of the block selection circuit 121 corresponding to the ground selection lines GSLa and GSLb if the ground enable signal GE may transition. The ground selection line driver 129 may be configured to float an output node if the ground enable signal GE may transition.

The address decoder 120' may include block selection circuits $121_0$ and $121_1$ and block wordline drivers $123_0$ and $123_1$ which may respectively correspond to memory blocks BLK0 and BLK1, and a common string selection line driver 125, a wordline driver 127, and a ground selection line driver 129 which may respectively correspond to the memory blocks BLK0 and BLK1. The nonvolatile memory device 100 according to example embodiments may be configured drive the ground selection line GSL according to the variation of the substrate voltage of the memory cell array 110 during an erase operation. Erase disturbance of the memory cells MC may be prevented, and the ground selection transistors GSTa and GSTb may be prevented from being erased. Reliability of the nonvolatile memory device 100 may be enhanced.

Figure 18:
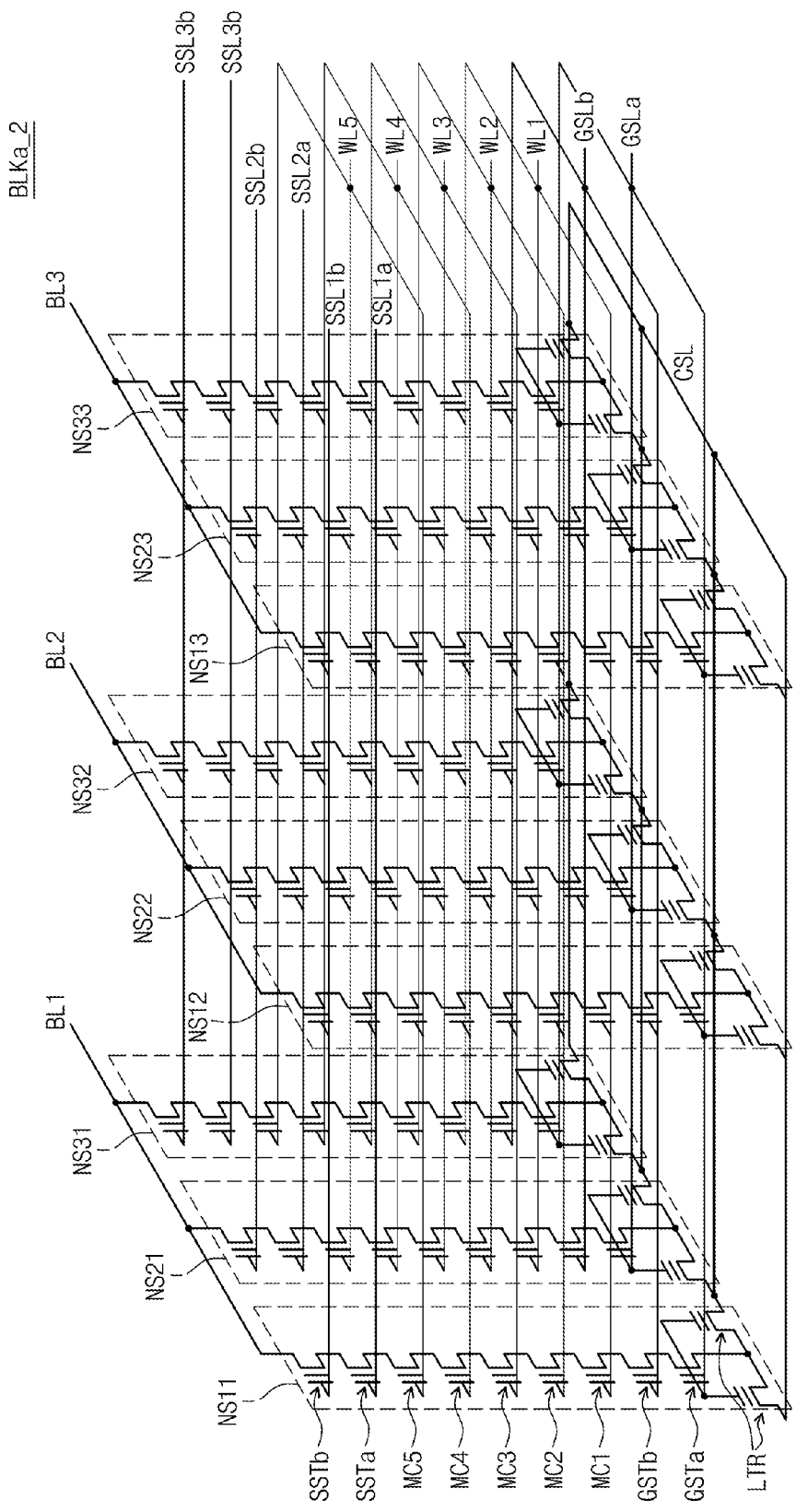

FIG. 18 is a circuit diagram illustrating application examples of an equivalent circuit in a memory block BLKa described with reference to FIGS. 3-5. As compared to the equivalent circuit described with reference to FIG. 6, a lateral transistor LTR may be additionally provided at each NAND string NS of a memory block BLKa_2. Lateral transistors LTR may be coupled between a ground selection transistor GSTa and a common source line CSL. Gates (or control gates) of the lateral transistors LTR and a gate (or control gate) of the ground selection transistor GSTa may be connected to a ground selection line GSLa.

As described with reference to FIGS. 3-6, the first conductive materials 211, 212, and 213 that may be adjacent to the substrate 111 may correspond to the ground selection line GSLa. When a target voltage is applied to the first conductive materials 211, 212, and 213, a channel may be formed in a region corresponding to the first conductive materials 211, 212, and 213 in the second-direction body 114. When a target voltage may be applied to the first conductive materials 211, 212, and 213, a channel may be formed in a region adjacent to the first conductive materials 211, 212, and 213 in the substrate 111. Similarly, a channel may be formed in the substrate 111 by a voltage of the first conductive materials 211, 212, and 213. First to fourth doping regions 311-314 may be connected to a surface layer 114 that may be operating as a second-direction body through channels that may be formed in the substrate 111 by the voltage of the first conductive materials 211, 212, and 213, respectively.

As described with reference to FIGS. 3-6, the first to fourth doping regions 311-314 may constitute a common source line CSL. The common source line CSL and the channels of the memory cells MC1-MC5 and the ground selection line GSLb may be electrically connected to each other through channels that may be formed by a voltage of the ground selection line GSLa to be perpendicular and parallel to the substrate 111. It will be understood that transistors that may be driven by the ground selection line GSLa and perpendicular and parallel to a substrate operate between the common source line CSL and the ground selection transistor GSTb. It will be understood that the transistor perpendicular to the substrate may be a ground selection transistor GSTa shown in FIG. 18 and the transistor parallel to the substrate may be a lateral transistor LTR shown in FIG. 18.

Figure 19:
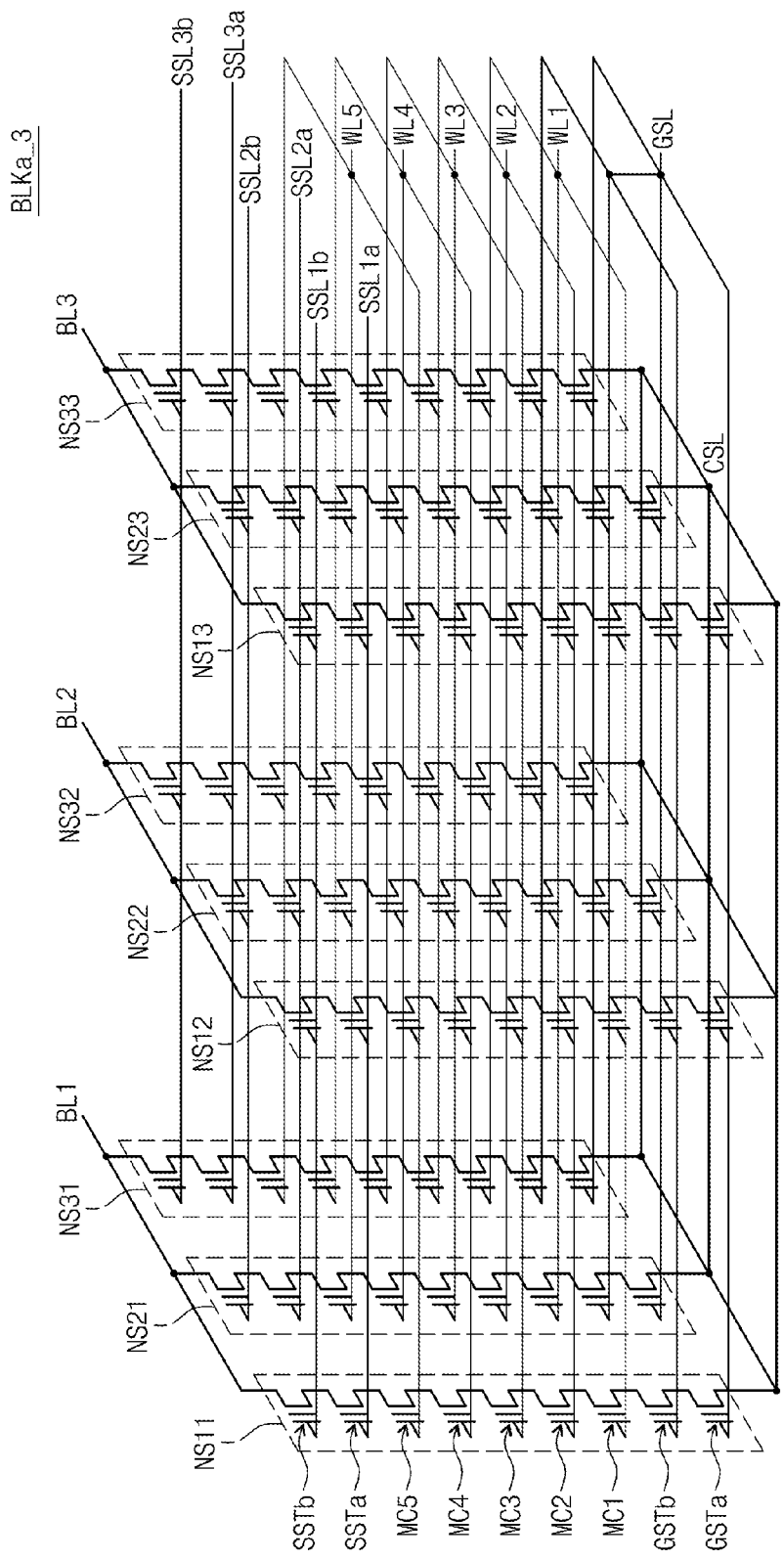

FIG. 19 is a circuit diagram illustrating other application examples of an equivalent circuit in a memory block BLKa described with reference to FIGS. 3-5. As compared to the memory block BLKa_1 described with reference to FIG. 6, two ground selection transistors GSTa and GSTb may be commonly connected to one ground selection line GSL in each NAND string NS of a memory block BLKa_3. The range of a target voltage Vtar may vary when the ground selection transistors GSTa and GSTb may be commonly connected to one ground selection line GSL. For example, the maximum value of the target voltage Vtar may be adjusted. The maximum value of the target voltage Vtar may be an average value of voltages where threshold voltages of the ground selection transistors GSTa and GSTb shown in FIG. 13 may start to vary.

Figure 20:
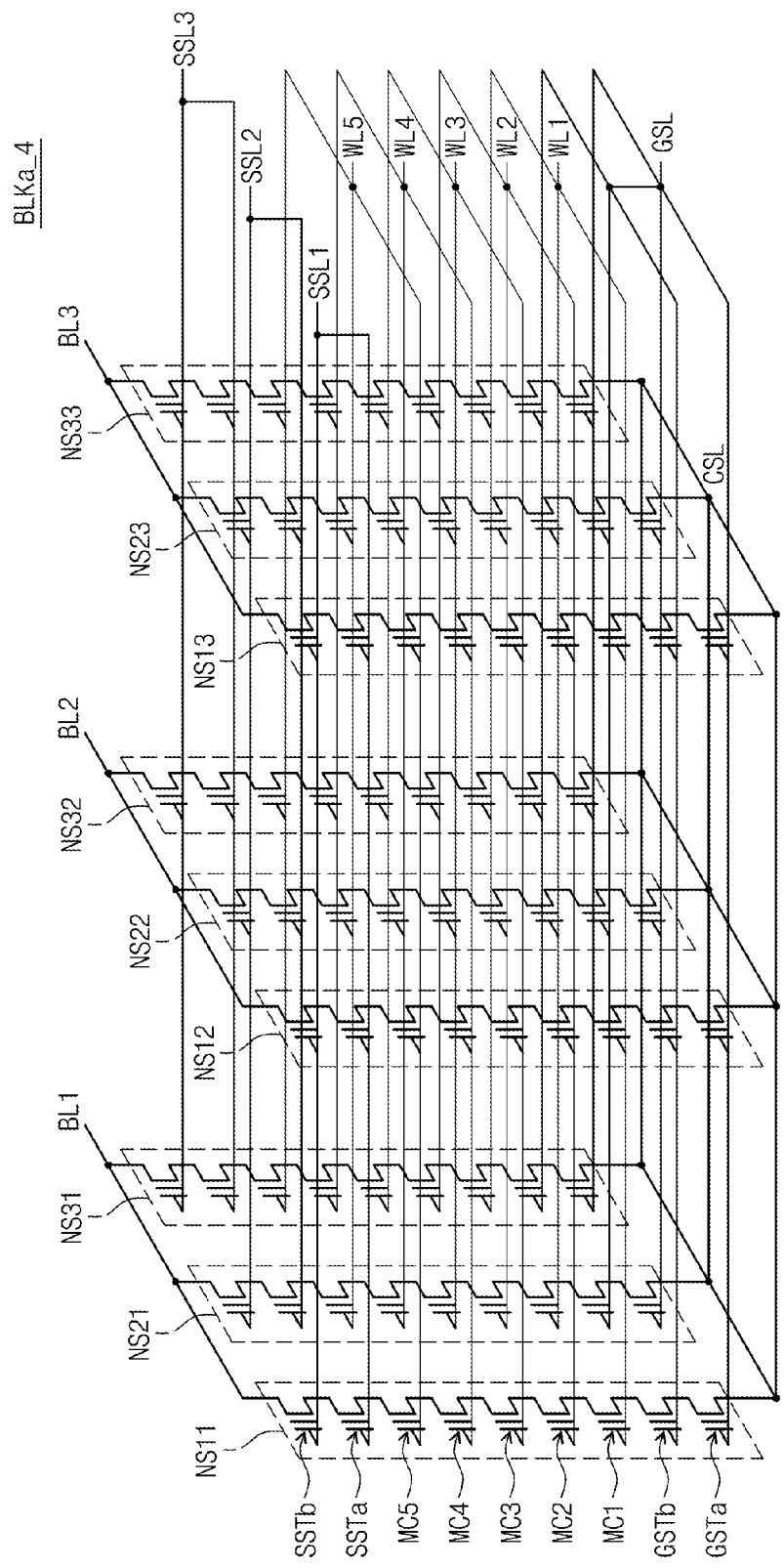

FIG. 20 is a circuit diagram illustrating still other application examples of an equivalent circuit in a memory block BLKa described with reference to FIGS. 3-5. As compared to the memory block BLKa_2, string selection transistors SSTa and SSTb may be commonly connected to one string selection line in the memory block BLKa_4.

Figure 21:
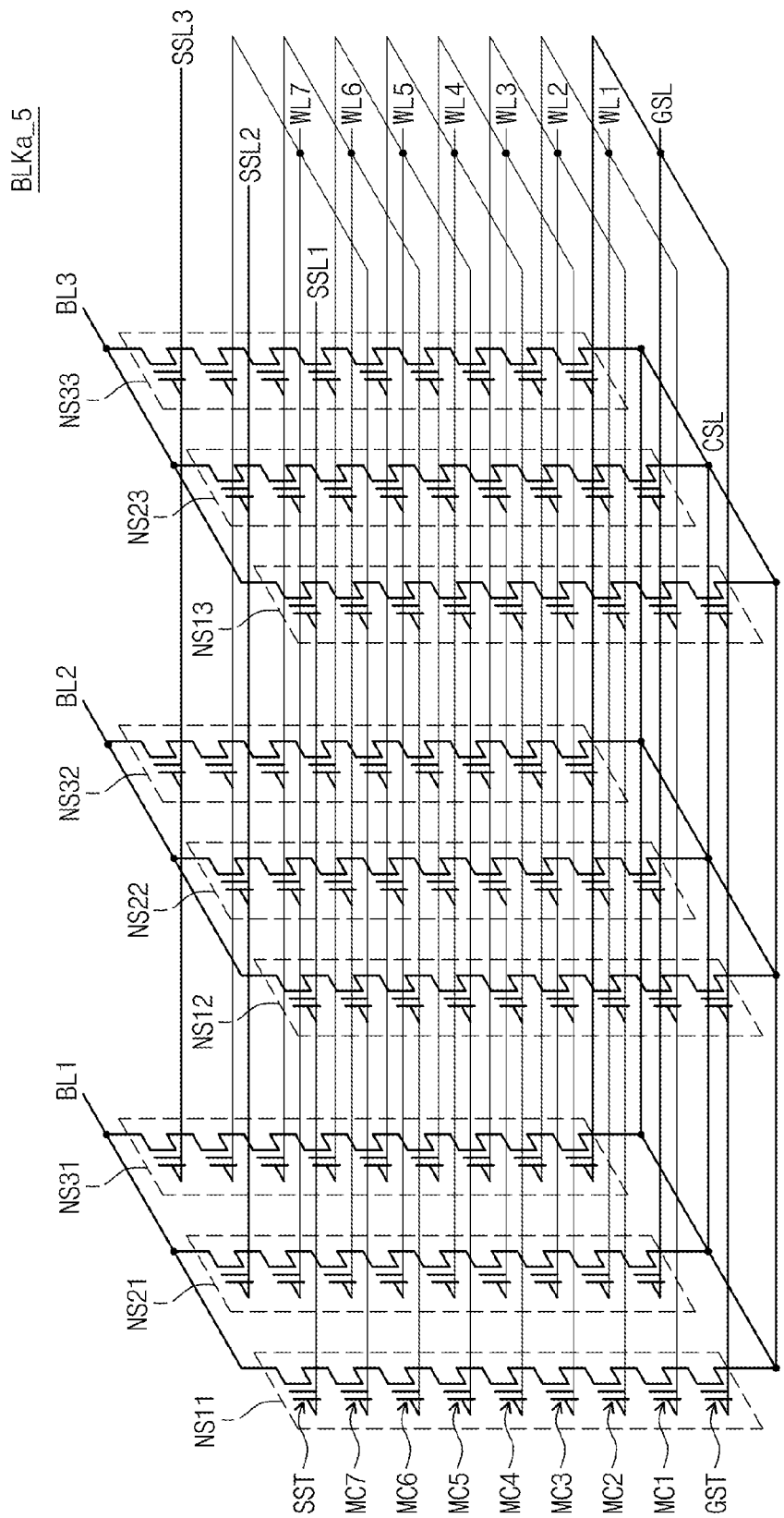

FIG. 21 is a circuit diagram illustrating yet other application examples of an equivalent circuit in a memory block BLKa described with reference to FIGS. 3-5. As compared to the memory block BLKa_1 shown in FIG. 6, one string selection transistor SST and one ground selection transistor GST may be provided to each NAND string NS of a memory block BLKa_5. The range of a target voltage Vtar may vary when one ground selection transistor is provided. For example, the maximum value of the target voltage Vtar may vary. The maximum value of the target voltage Vtar may turn to a voltage where a threshold voltage of the ground selection transistor GST as shown in FIG. 13 starts to vary.

Figure 22:
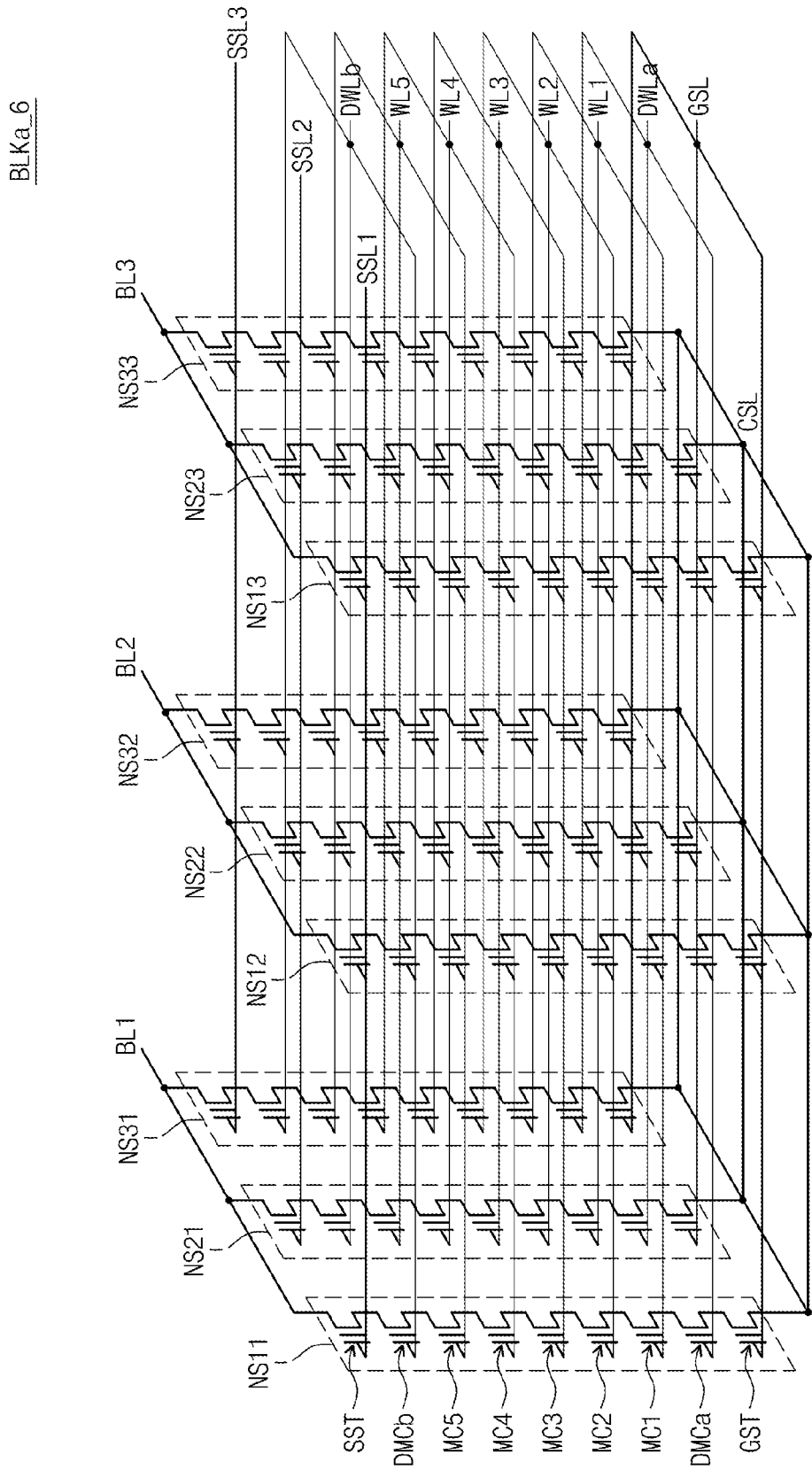

FIG. 22 is a circuit diagram illustrating yet still other application examples of an equivalent circuit in a memory block BLKa described with reference to FIGS. 3-5. As compared to the memory block BLKa, in each NAND string NS of the memory block BLKa_6, dummy memory cells DMCa and DMCb may be provided between string selection transistor SST and memory cells MC1-MC5 and between ground selection transistor GST and the memory cells MC1-MC5. The dummy memory cells DMCa and DMCb may be connected to dummy wordlines DWLa and DWLb. Dummy memory cells DMC may be provided either between the string selection transistor SST and the memory cells MC1-MC5 or between the ground selection transistor GST and the memory cells MC1-MC5. The dummy memory cells DMC may be provided between the memory cells MC1-MC5. The number of the dummy memory cells DMC is not limited.

Figure 23:
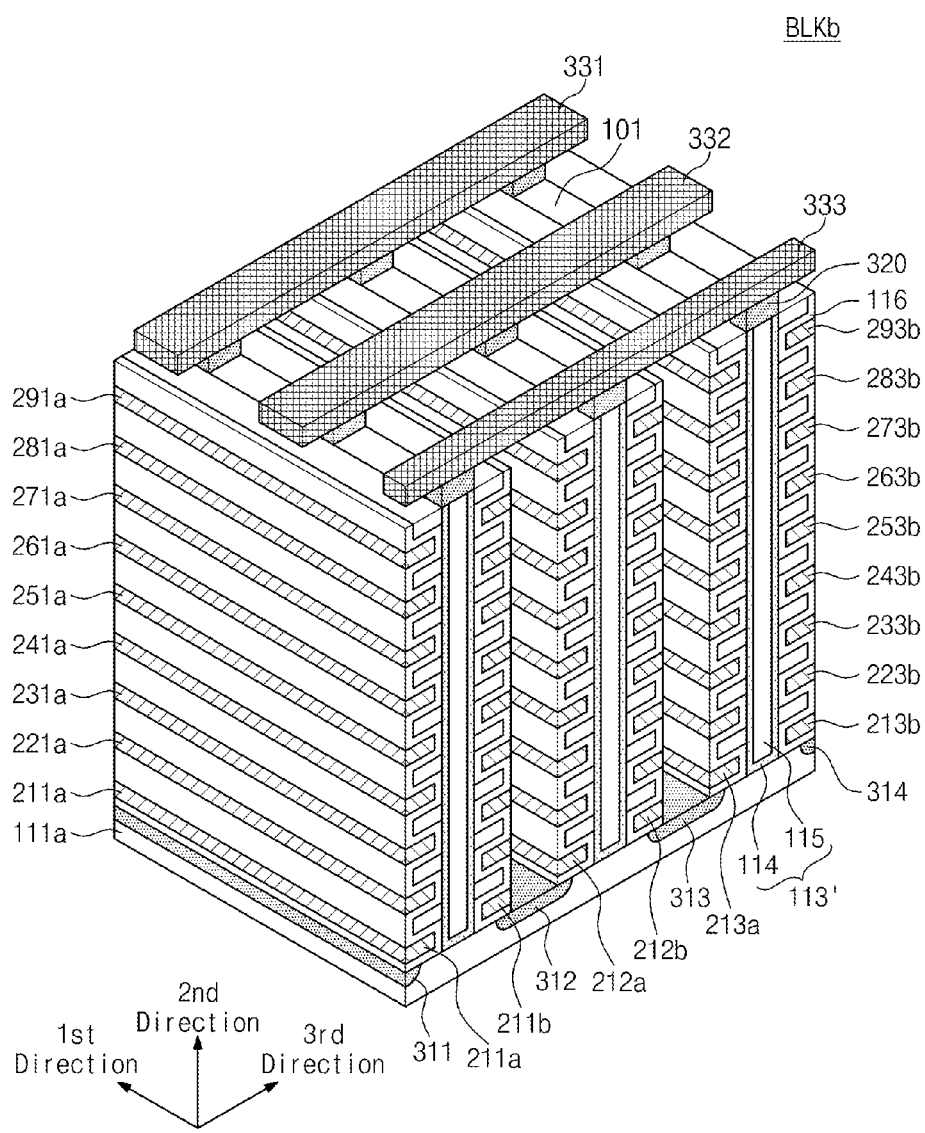

FIG. 23 is a perspective diagram illustrating other example embodiments of a memory block of FIG. 2. As compared to the memory block BLKa shown in FIG. 3, in a memory block BLKb, pillars 113' may be provided in the form of square pillar. Insulating materials 101 may be provided between pillars 113' arranged in a first direction. The insulating materials 101 may extend in a second direction to be connected to a substrate 111. The insulating materials 101 may extend in the first direction in a region except for a region where the pillars 113' may be provided. The first conductive materials 211-291, 212-292, and 213-293 may be divided into first portions 211a-291a, 212a-292a, and 213a-293a and second portions 211b-291b, 212b-292b, and 213b-293b.

In a region on the first and second doping regions 311 and 312, each pillar 113' may constitute first portions 211a-291a of first conductive materials, an insulating layer 116, and one NAND string NS as well as second portions 211b-291b of the first conductive materials, an insulating layer 116, and another NAND string NS. In a region on the second and third doping regions 312 and 313, each pillar 113' may constitute first portions 212a-292a of first conductive materials, an insulating layer 116, and one NAND string NS as well as second portions 212b-292b of the first conductive materials, an insulating layer 116, and another NAND string NS. In a region on the third and fourth doping regions 313 and 314, each pillar 113' may constitute first portions 213a-293a of first conductive materials, an insulating layer 116, and one NAND string NS as well as second portions 213b-293b of the first conductive materials, an insulating layer 116, and another NAND string NS.

The first and second portions 211a-291a and 211b-291b of first conductive materials that may be provided at both side surfaces of each pillar 113' may be divided using an insulating material 101. Each pillar 113' may constitute two NAND strings NS. A cross-sectional diagram of the memory block BLKb described with reference to FIG. 23 may be similar to the cross-section of FIG. 4. A cross-sectional view and the detailed description of the memory block BLKb may be omitted herein.

Figure 24:
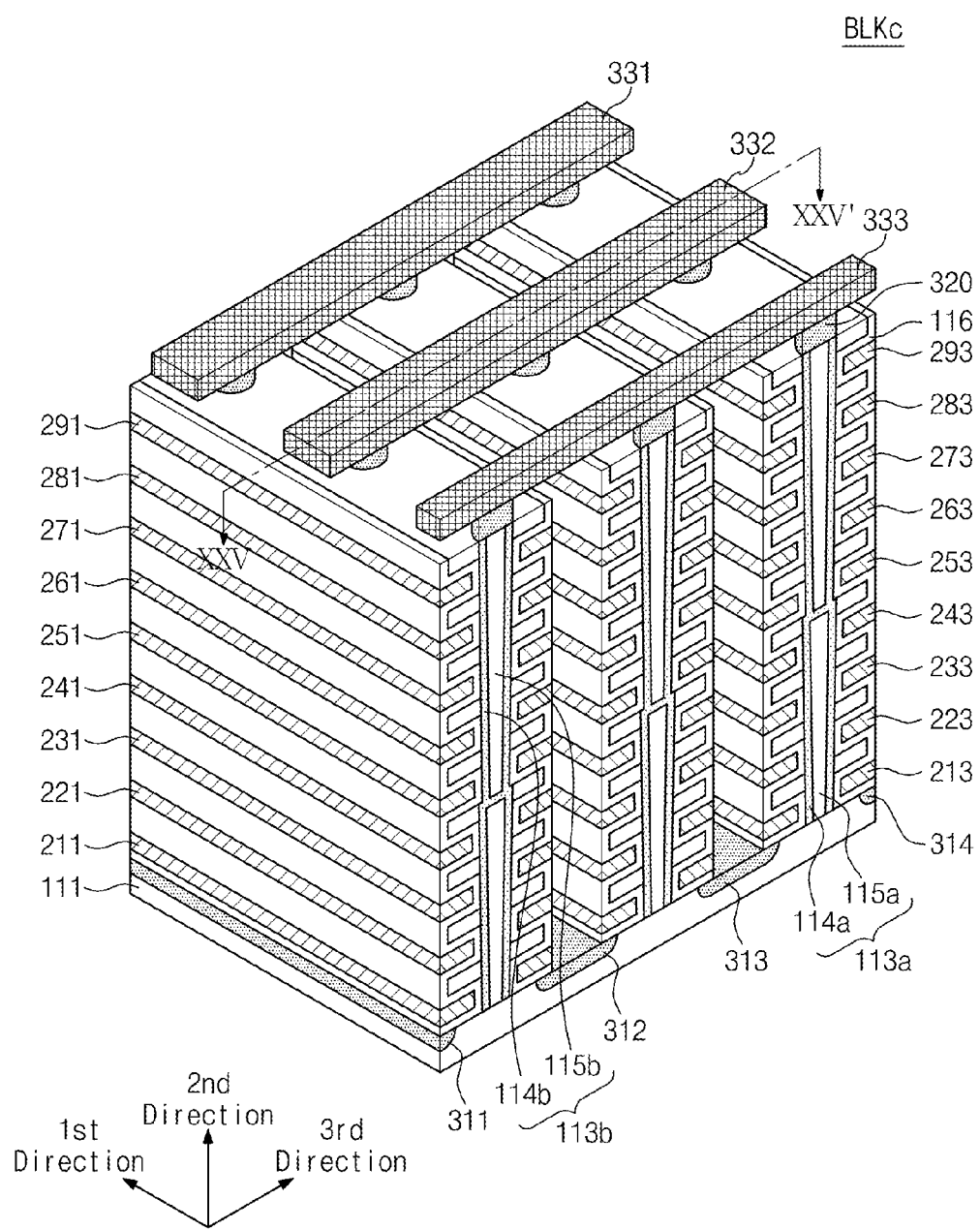
Figure 25:
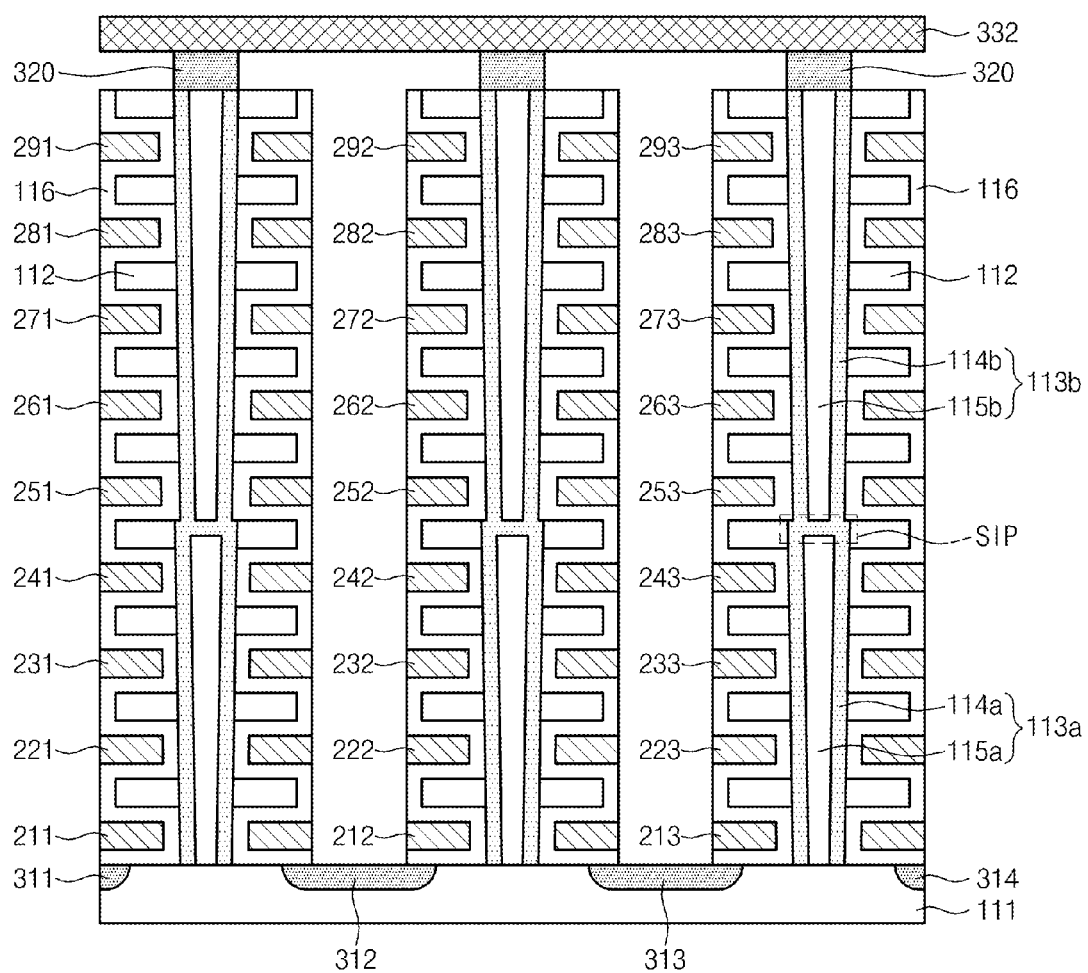

FIG. 24 is a perspective diagram illustrating still other example embodiments of a memory block of FIG. FIG. 25 is a cross-sectional diagram taken along the line XXV-XXV' of a memory block shown in FIG. 24. As compared to the memory block BLKa described with reference to FIG. 3, one pillar in a memory block BLKc may include a first sub-pillar 113a and a second sub-pillar 113b. Except that the pillar 113 of the memory block BLKa may be replaced with the first and second sub-pillars 113a and 113b, the memory block BLKc may have the same configuration as the memory block BLKa. Therefore, duplicate explanation will be omitted herein.

Referring to FIGS. 24 and 25, a first sub-pillar 113a may be provided on a substrate 111. A surface layer 114a of the first sub-pillar 113a may include a p-type silicon material. The surface layer 114a of the first sub-pillar 113a may operate as a second-direction body. An internal layer 115a of the first sub-pillar 113a may be made of an insulating material. A second sub-pillar 113b may be provided on the first sub-pillar 113a. A surface layer 114b of the second sub-pillar 113b may include a p-type silicon material. The surface layer 114b of the second sub-pillar 113b may operate as a second-direction body. An internal layer 115b of the second sub-pillar 113b may be made of an insulating material. The surface layer 114a of the first sub-pillar 113a and the surface layer 114b of the second sub-pillar 113b may be connected to each other. The surface layer 114a of the first sub-pillar 113a and the surface layer 114b of the second sub-pillar 113b may be connected to each other through a p-type, intrinsic or n-type silicon pad SIP (not shown).

Figure 26:
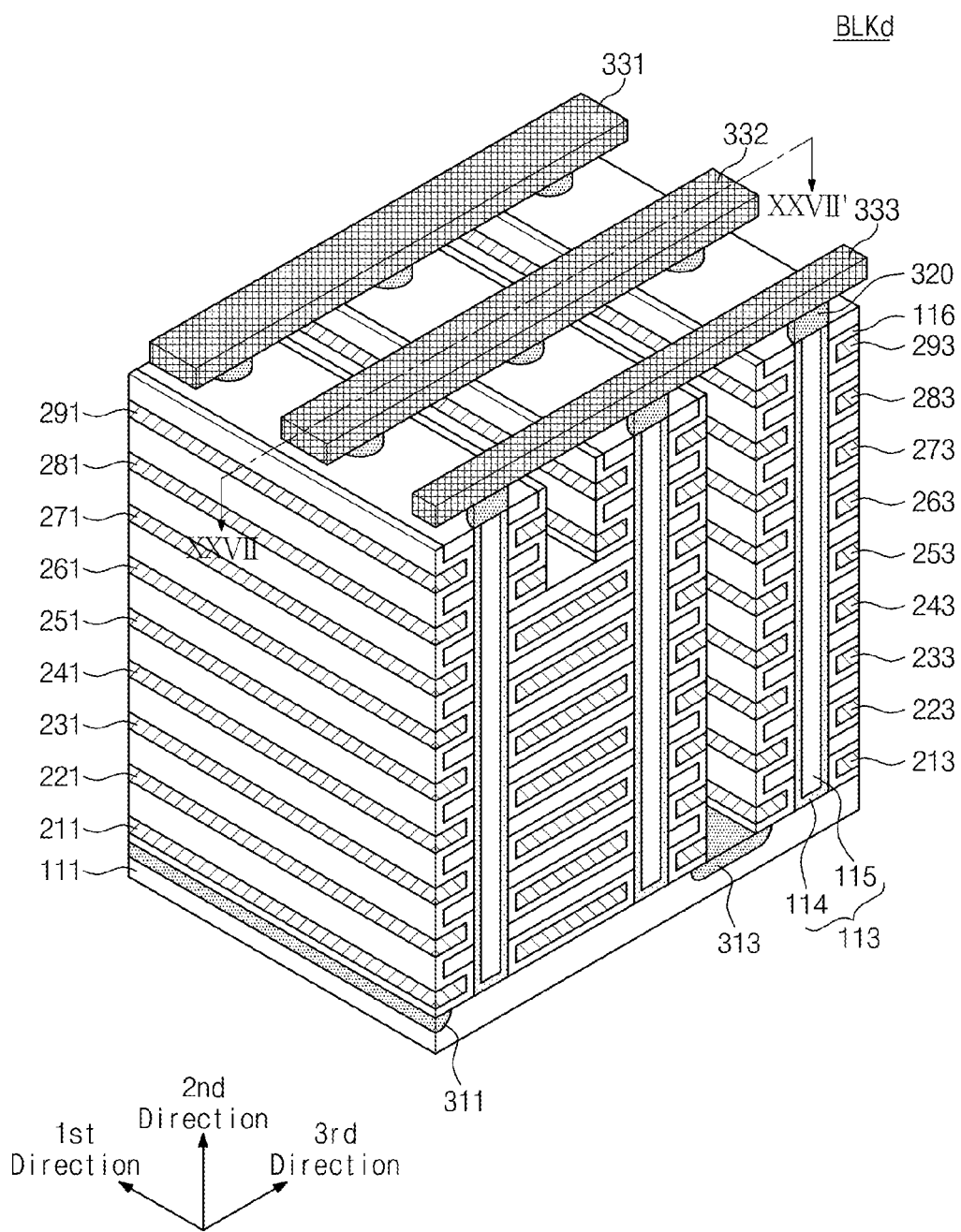
Figure 27:
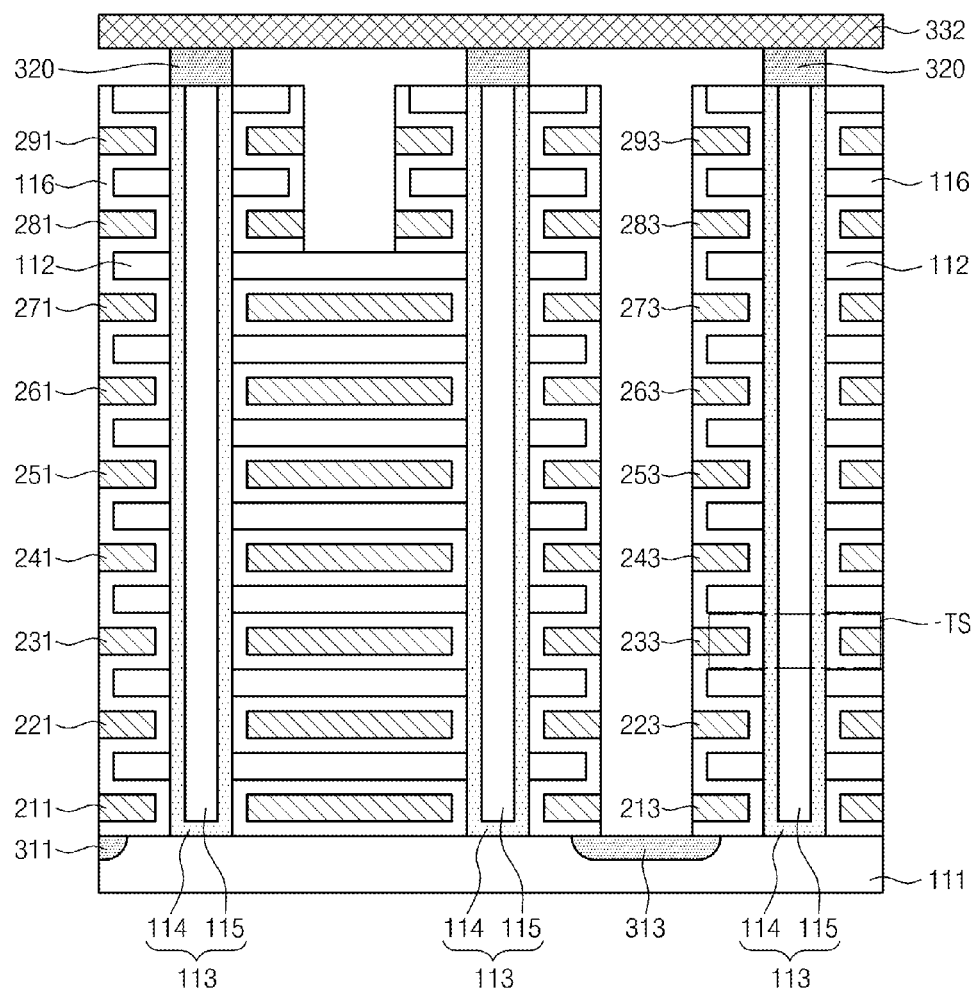

FIG. 26 is a perspective diagram illustrating further example embodiments of a memory block of FIG. 2. FIG. 27 is a cross-sectional diagram taken along the line XXVII-XXVII' of the memory block BLKd shown in FIG. 26. As compared to the memory block BLKa described with reference to FIG. 3, first conductive materials 211-271 and 212-272, corresponding insulating materials 112, and an insulating layer 116, may be connected to each other in a third direction at a region corresponding to a second doping region 312.

Figure 28:
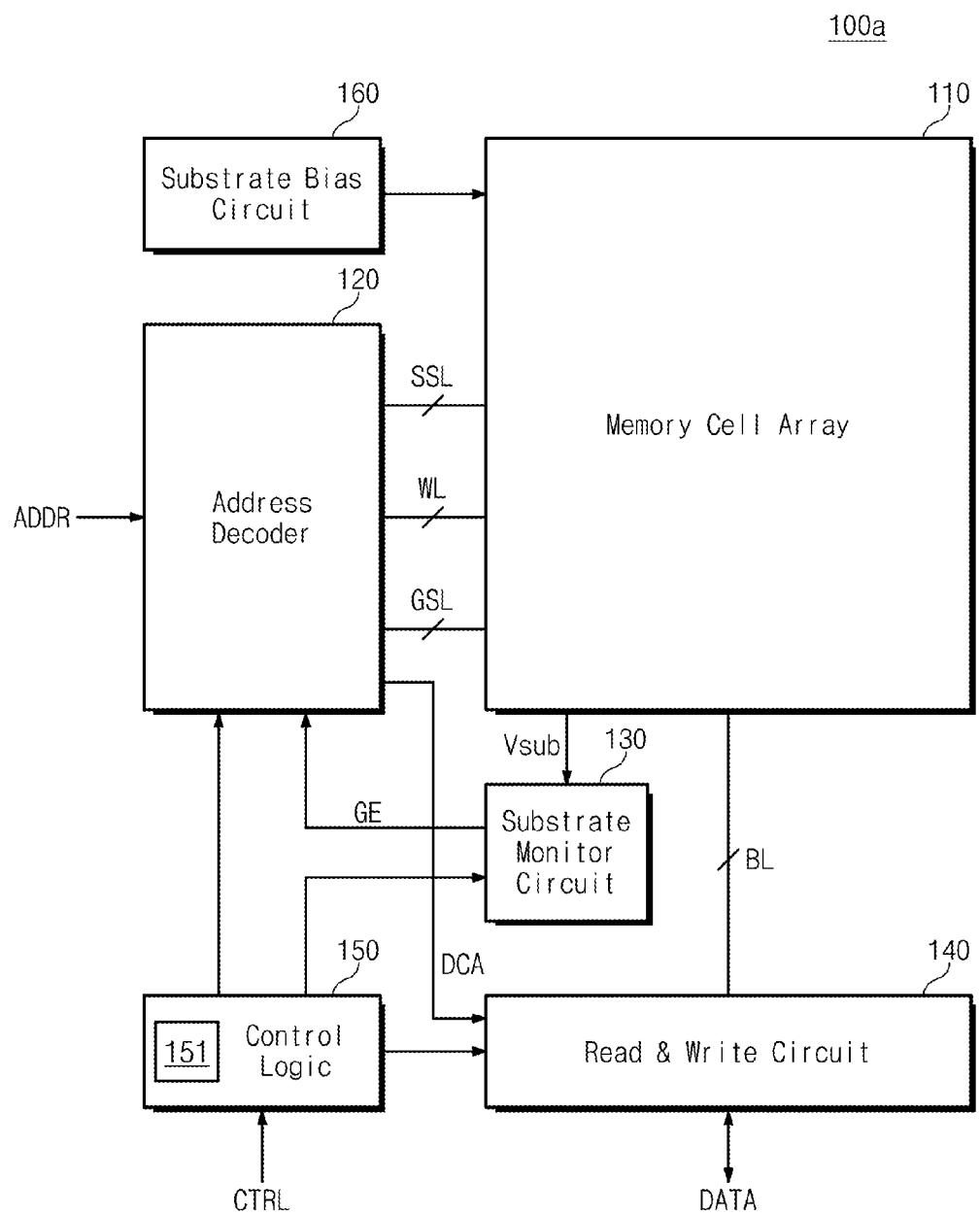

FIG. 28 is a block diagram illustrating nonvolatile memory devices according to other example embodiment of the inventive concepts. As compared to the nonvolatile memory device 100 in FIG. 1, a control logic 150 of the nonvolatile memory device 100a may further include a program circuit 151. The program circuit 151 may be configured to store code signals CODE1 and CODE2 (see FIG. 15) determining a level of a target voltage Vtar. The program circuit 151 may be programmed according to an external command. The level of the target voltage Vtar may vary with external control. The program circuit 151 may include an electrical fuse, a nonvolatile storage circuit, and/or a laser fuse. The control logic 150 may output the code signals CODE1 and CODE2 stored in the program circuit 151 to a substrate monitor circuit 130.

Figure 29:
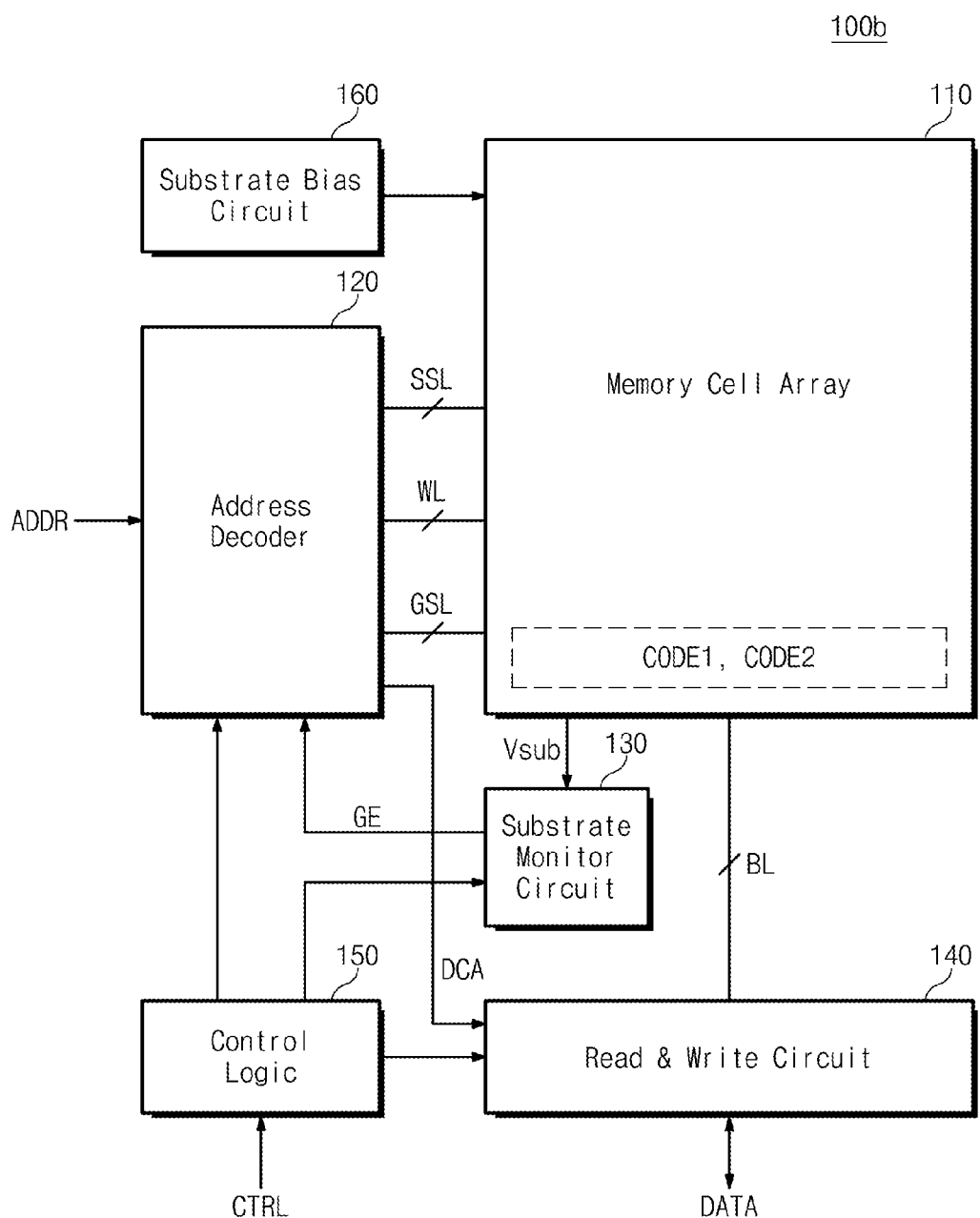

FIG. 29 is a block diagram illustrating nonvolatile memory devices according to still other example embodiments of the inventive concepts. As compared to the nonvolatile memory device 100 in FIG. 1, code signals CODE1 and CODE2 may be stored in a memory cell array 110 of a nonvolatile memory device 100b to determine a target voltage Vtar. A control logic 150 may read the code signals CODE1 and CODE2 stored in the memory cell array 110 during power-on and output the read code signals CODE1 and CODE2 to a substrate monitor circuit 130. The memory cell array 110 may be divided into a data area and a spare area. The data area may be an area in which user data is stored. The code signals CODE1 and CODE2 may be stored in the spare area. Manufacturer information may be further stored in the spare area. The spare area may be used as a buffer area for storing user data in the data area. Various types of information for controlling the nonvolatile memory device 100b may be stored in the spare area.

Figure 30:
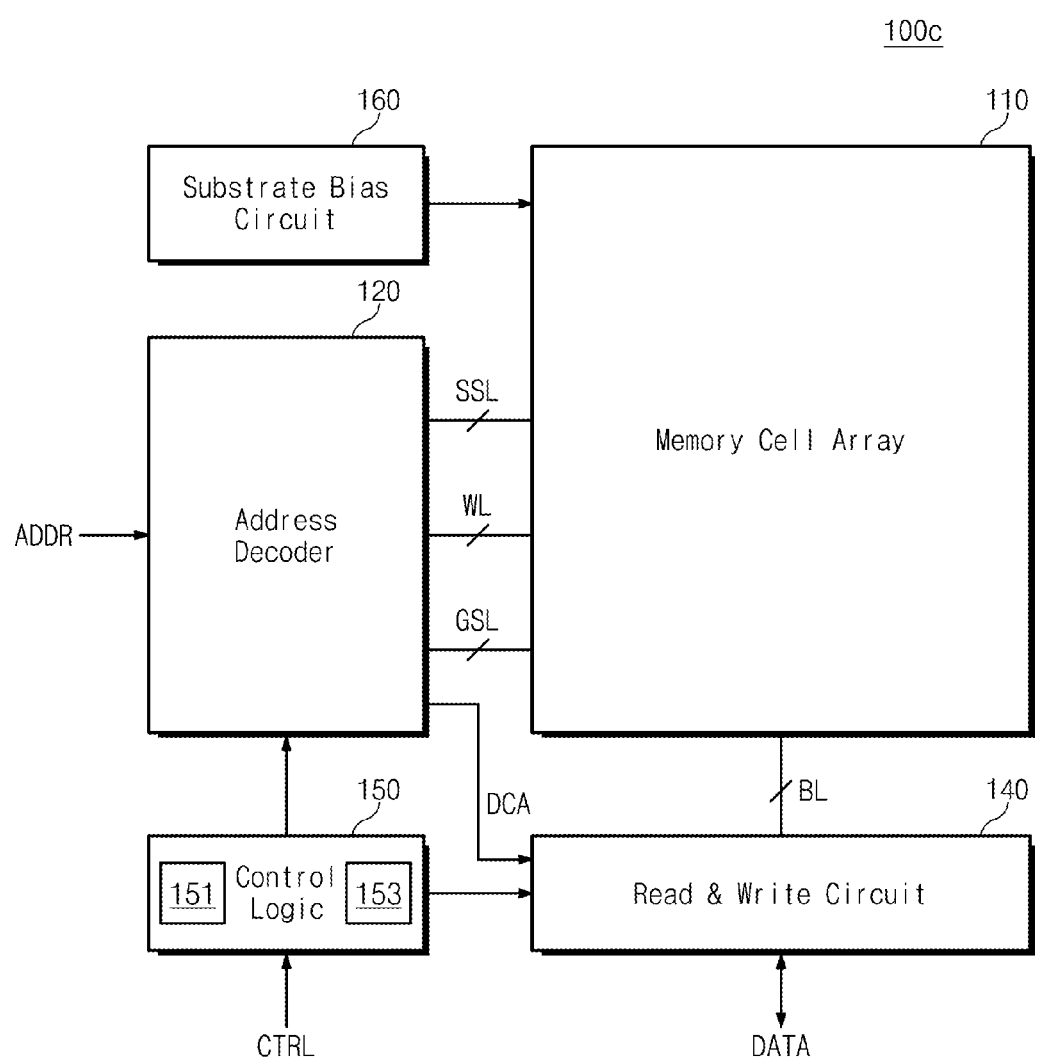

FIG. 30 is a block diagram illustrating nonvolatile memory devices according to yet other example embodiments of the inventive concepts. As compared to the nonvolatile memory device 100a in FIG. 28, a nonvolatile memory device 100c may not be provided with a substrate monitor circuit 130. A control logic 150 may include a program circuit 151 and a counter 153. Time information may be stored in the program circuit 151. The time information may be time to floating ground selection lines GSLa and GSLb from supplying an erase voltage Vers to a substrate 111 and supplying a ground voltage Vss to the ground selection lines GSLa and GSLb.

For example, the time information may be detected through an erase test for the nonvolatile memory device 100c, and the detected time information may be stored in the program circuit 151. The time information may be set such that a difference between a voltage of the substrate 111 and a voltage of the ground selection line GSLb has a value within the range described with reference to FIGS. 12-14. If the erase voltage Vers may be supplied to the substrate 111, the counter 153 may start counting. When a count value of the counter 153 may match time information stored in the program circuit 151, the control logic 150 may control an address decoder 120 to float the ground selection lines GSLa and GSLb.

Figure 31:
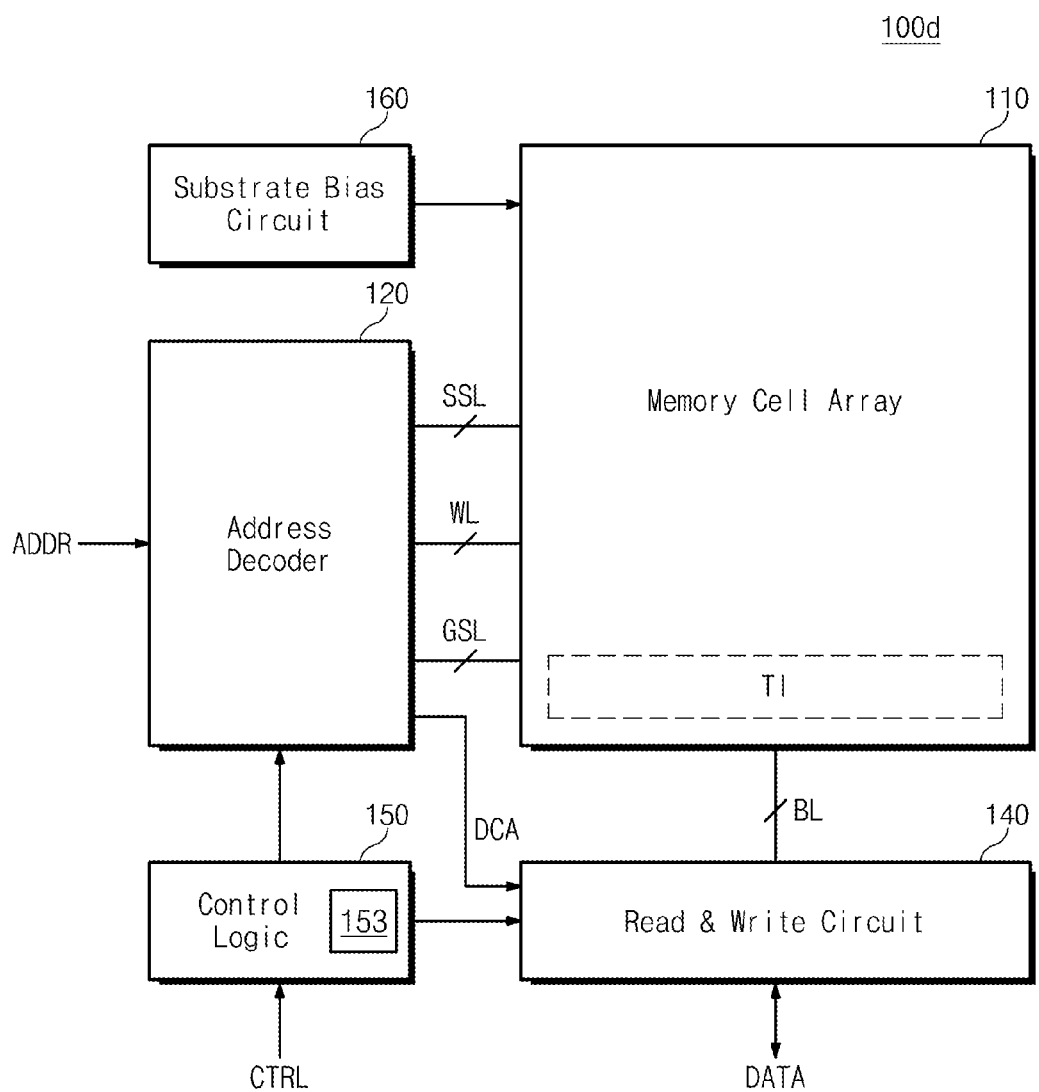

FIG. 31 is a block diagram illustrating nonvolatile memory devices according to yet still other example embodiments of the inventive concepts. As compared to the nonvolatile memory device 100b in FIG. 29, a nonvolatile memory device 100d may not be provided with a substrate monitor circuit 130. A control logic 150 may include a counter 153. Time information TI may be stored in a memory cell array 110. The time information TI may be time to floating ground selection lines GSLa and GSLb from supplying an erase voltage Vers to a substrate 111 and supplying a ground voltage Vss to the ground selection lines GSLa and GSLb. For example, the time information may be detected through an erase test for the nonvolatile memory device 100d, and the detected time information may be stored in the memory cell array 110. The time information may be set such that a difference between a voltage of the substrate 111 and a voltage of the ground selection line GSLb has a value within the range described with reference to FIGS. 12-14. The time information TI may be stored in a buffer area of the memory cell array 110.

Figure 32:
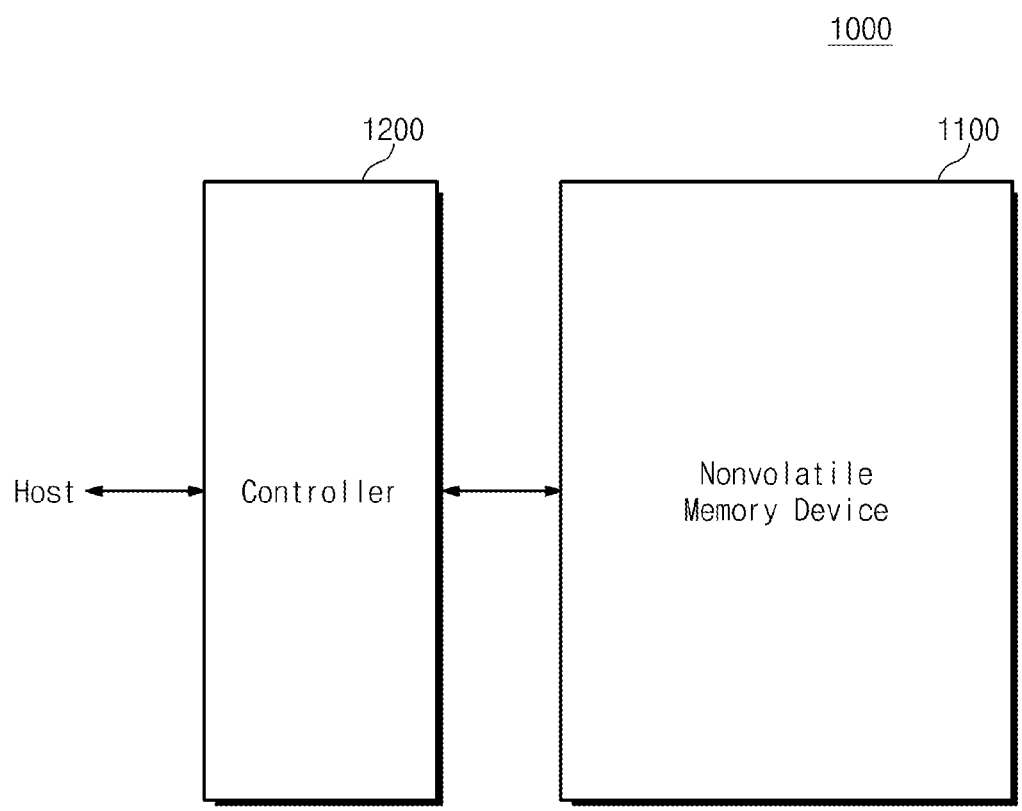

FIG. 32 is a block diagram illustrating memory systems including a nonvolatile memory device shown in FIG. 1. Referring to FIG. 32, a memory system 1000 may include a nonvolatile memory device 1100 and a controller 1200. The nonvolatile memory device 1100 may be configured to operate as described with reference to FIGS. 1-31. For example, the nonvolatile memory device 1100 may apply a target voltage to ground selection lines GSLa and GSLb during an erase operation. The nonvolatile memory device 1100 may be configured to float the ground selection line GSL according to the voltage variation of the substrate 111 of the nonvolatile memory device 1100. Erase disturbance may be prevented and reliability of the nonvolatile memory device 1100 and the memory system 1000 that may include the nonvolatile memory device 1100 may be improved.

The controller 1200 may be connected to a host (Host) and the nonvolatile memory device 1100. In response to a request from the host, the controller 1200 may be configured to access the nonvolatile memory device 1100. For example, the controller 1200 controls the read, write, erase and background operations of the nonvolatile memory device 1100. The controller 1200 may be configured to provide interface between the nonvolatile memory device 1100 and the host. The controller 1200 may be configured to drive firmware for controlling the nonvolatile memory device 1100.

The controller 1200 may further include well-known elements such as a random access memory (RAM), a processing unit, a host interface, and a memory interface n (not illustrated). The RAM may be used as at least one of a working memory of the processing unit, a cache memory between the nonvolatile memory device 1100 and the host, and a buffer memory between the nonvolatile memory device 1100 and the host. The processing unit may control the overall operation of the controller 1200.

The host interface may include a protocol for data exchange between the host and the controller 1200. The host interface may be configured to communicate with an external entity (e.g., a host) through at least one of various interface protocols, for example, a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and an Integrated Drive Electronics (IDE) protocol.

The memory system 1000 may further include an error correction block (not illustrated). The error correction block may be configured to detect and correct the error of data read from the nonvolatile memory device 1100 with an error correction code (ECC). The error correction block may be provided as the element of the controller 1200. The error correction block may be provided as an element of the nonvolatile memory device 1100.

The controller 1200 and the nonvolatile memory device 1100 may be integrated into one semiconductor device. The controller 1200 and the nonvolatile memory device 1100 may be integrated into one semiconductor device to configure a memory card. For example, the controller 1200 and the nonvolatile memory device 1100 may be integrated into one semiconductor device to configure a memory card, for example, a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC) and a universal flash memory device (UFS).

The controller 120 and the nonvolatile memory device 1100 may be integrated into one semiconductor device to configure a solid state drive (SSD). The semiconductor drive (SSD) may include a storage unit configured to store data in a semiconductor memory. If the memory system 1000 may be used as the solid state drive (SSD), the operating speed of the host connected to the memory system 1000 may be improved (e.g., dramatically improved). As another example embodiment, the memory system 1000 may be provided as one of various elements for electronic devices, for example, computers, Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices, and one of various elements configuring a computing system.

The nonvolatile memory device 1100 or the memory system 1000 may be packaged as one of various types to be subsequently embedded. For example, the nonvolatile memory device 1100 or the memory system 1000 may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 33:
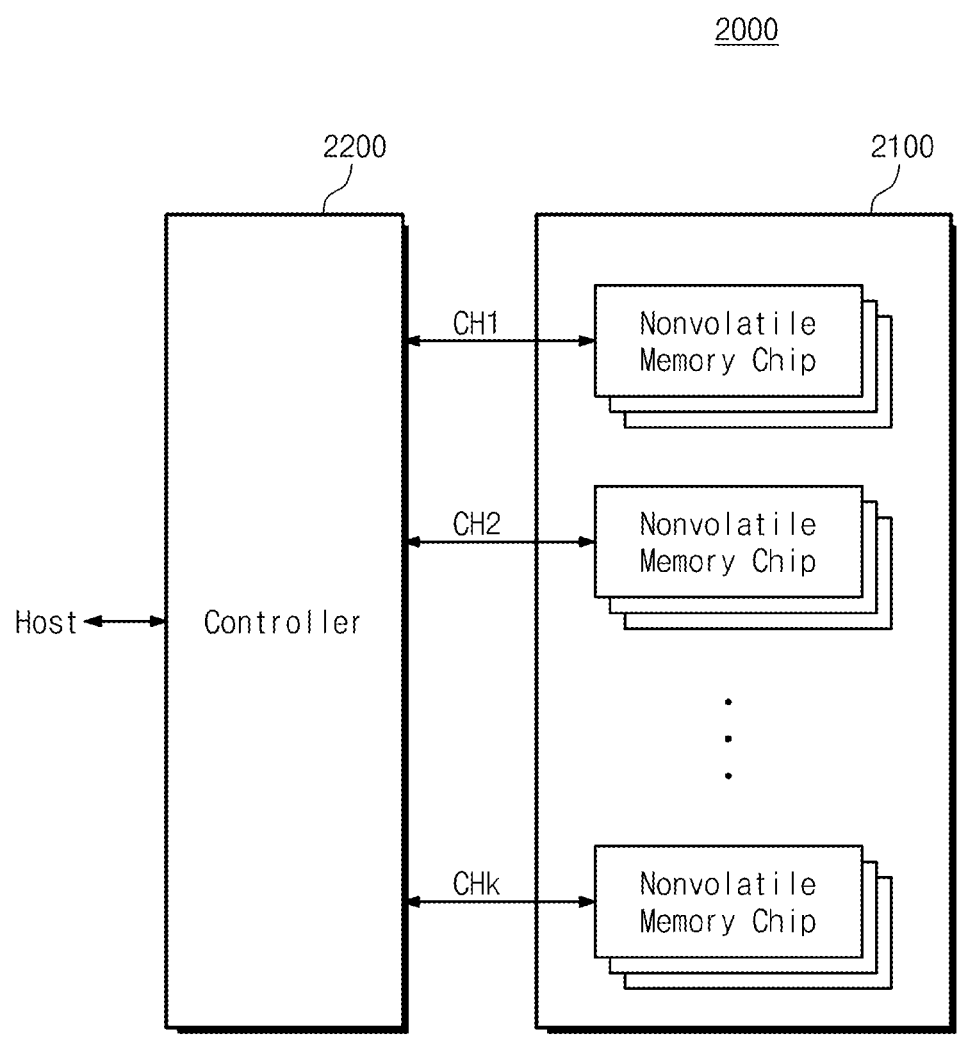

FIG. 33 is a block diagram illustrating application examples of a memory system of FIG. 32. Referring to FIG. 33, a memory system 2000 may include a nonvolatile memory device 2100 and a controller 2200. The nonvolatile memory device 2100 may include a plurality of nonvolatile memory chips. The nonvolatile memory chips may be divided into a plurality of groups. Each group of the nonvolatile memory chips may be configured to communicate with the controller 2200 through one common channel. In FIG. 33, it is illustrated that the nonvolatile memory chips communicate with the controller 2200 through first to kth channels CH1-CHk.

Each of the nonvolatile memory chips may be configured with the same structure as the nonvolatile memory device 100 described with reference to FIGS. 1-31. The nonvolatile memory chip may be configured to apply a target voltage to a ground selection line GSL during an erase operation. The nonvolatile memory chip may be configured to float the ground selection line GSL according to voltage variation of a substrate. Reliability of the memory system 2000 may be enhanced. In FIG. 33, it is described that a plurality of nonvolatile memory chips are connected to one channel. However, it will be understood that the memory system 2000 may be modified such that one nonvolatile memory chip is connected to one channel.

Figure 34:
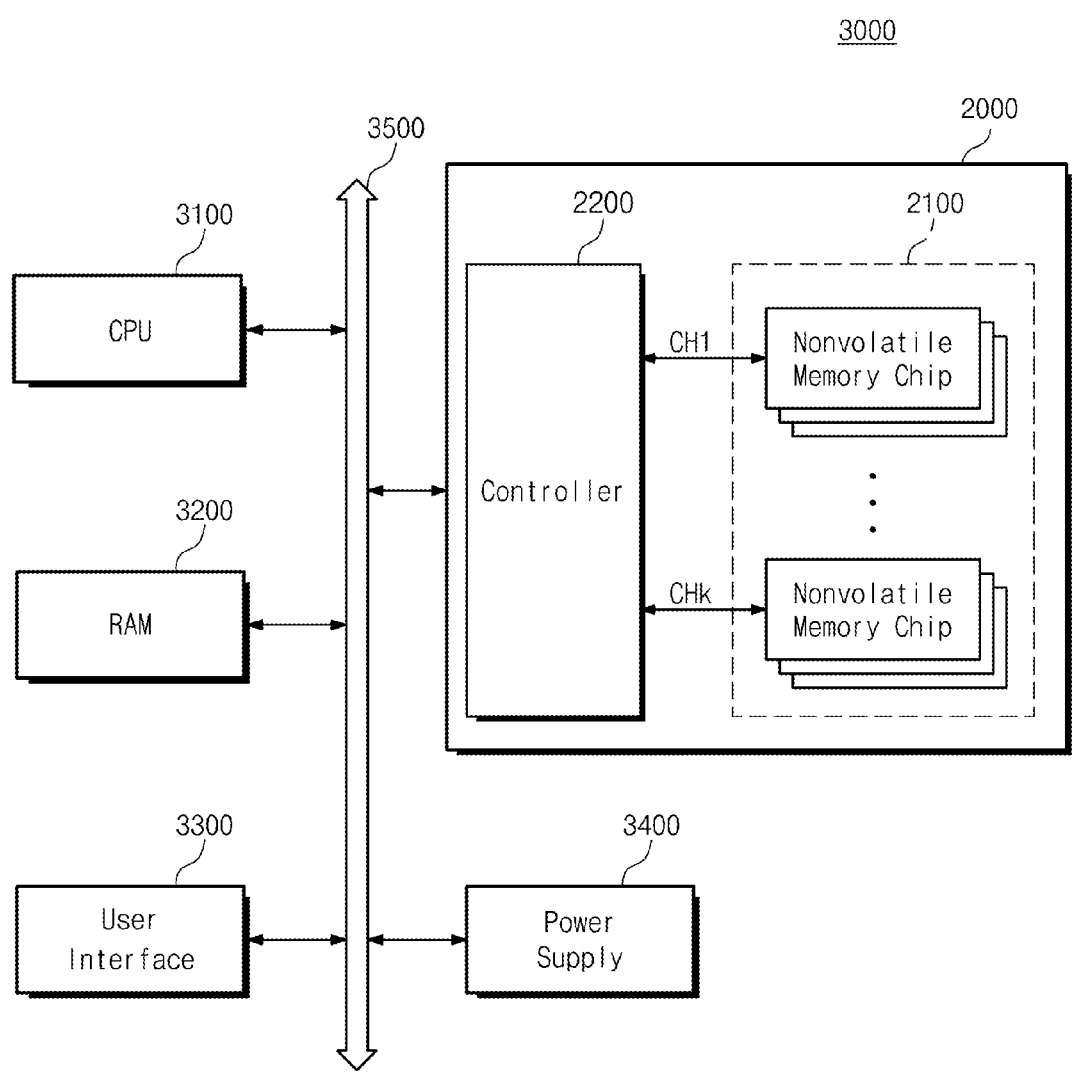

FIG. 34 is a block diagram illustrating computing systems including a memory system described with reference to FIG. 33. A computing system 3000 may include a central processing unit (CPU) 3100, a random access memory (RAM) 3200, a user interface 3300, a power supply 3400 and a memory system 2000. The memory system 2000 may be electrically connected to the CPU 3100, the RAM 3200, and the power supply 3400 through a system bus 3500. Data that may be provided through the user interface 3300 or that may be processed by the CPU 3100 may be stored in the memory system 2000.

In FIG. 34, it is illustrated that the nonvolatile memory device 2100 may be connected to the system bus 3500 through the controller 2200. However, the nonvolatile memory device 2100 may be configured to be directly connected to the system bus 3500. In this case, the CPU 3100 may control read and erase operations of the nonvolatile memory device 2100. The CPU 3100 may control a refresh operation of the nonvolatile memory device 2100. In FIG. 34, it is described that the memory system 2000 described with reference to FIG. 33 is provided. However, the memory system 2000 may be replaced with the memory system 1000 described with reference to FIG. 32.

The computing system 3000 may be configured to include both the memory systems 1000 and 2000 described with reference to FIGS. 32 and 33. According to the example embodiments described so far, erase disturbance caused by the activation of a ground selection transistor is prevented to provide a reliability-improved nonvolatile memory device, an erase method thereof, and a memory system including the same.

While example embodiments have been particularly shown and described, it will be understood by one of ordinary skill in the art that variations in form and detail may be made therein without departing from the spirit and scope of the claims.

What is claimed is:

1. A nonvolatile memory device, comprising:
    a memory cell array including a plurality of memory cell strings on a substrate;
    a read and write circuit connected to the memory cell strings through a plurality of bitlines, the read and write circuit configured to drive the bitlines;
    a substrate bias circuit configured to supply an erase voltage to the substrate during an erase operation;
    a program circuit configured to store time information;
    a counter configured to start counting when the erase voltage is supplied to the substrate during the erase operation; and
    an address decoder connected to the memory cell strings through a plurality of wordlines, at least one string selection line, and at least one ground selection line, the address decoder configured to supply a low voltage to the at least one ground selection line and the wordlines during the erase operation, the address decoder configured to float the at least one ground selection line when a count value of the counter matches the time information.

2. The nonvolatile memory device of claim 1, wherein the low voltage is a ground voltage.

3. The nonvolatile memory device of claim 1, wherein the time information is set such that a difference between a voltage of the substrate and a voltage of the at least one ground selection line is about 3.5 volts to 11 volts.

4. The nonvolatile memory device of claim 1, wherein the program circuit is a part of the memory cell array.

5. The nonvolatile memory device of claim 1, wherein each of the memory cell strings includes at least one ground selection transistor, a plurality of memory cells, and at least one string selection transistor stacked in a direction perpendicular to the substrate.

6. The nonvolatile memory device of claim 5, wherein the memory cell array includes,
    a plurality of structures including conductive materials and insulating materials alternately stacked in the direction perpendicular to the substrate, and
    a plurality of pillars connected to the substrate through the structures in the direction perpendicular to the substrate,
    wherein the memory cell strings include the structures and the pillars.

7. The nonvolatile memory device of claim 6, wherein the memory cell array further includes a plurality of doping regions in the substrate between the structures, the doping regions being a common source line commonly connected to the cell strings.

8. The nonvolatile memory device of claim 6, wherein the memory cell array further includes a plurality of insulating layers provided between the conductive materials and the pillars.

9. A nonvolatile memory device, comprising:
    a memory cell array including a plurality of memory cell strings on a substrate;
    a read and write circuit connected to the memory cell strings through a plurality of bitlines, the read and write circuit configured to drive the bitlines;
    a substrate bias circuit configured to supply an erase voltage to the substrate during an erase operation;
    a substrate monitor circuit configured to monitor a voltage level of the substrate and output a monitoring result during the erase operation;
    a program circuit configured to store target voltage information; and
    an address decoder connected to the memory cell strings through a plurality of wordlines, at least one string selection line, and at least one ground selection line, the address decoder configured to supply a low voltage to the at least one ground selection line and the wordlines during the erase operation, the address decoder configured to, based on the monitoring result, float the at least one ground selection line when the voltage level of the substrate matches the target voltage information.

10. The nonvolatile memory device of claim 9, wherein the substrate monitor circuit includes,
    first and second trimmers coupled between a ground node and a substrate node to which a voltage of the substrate is supplied, and
    a comparator configured to compare a target voltage with a voltage at a node between the first and second trimmers and output a result of the comparison.

11. The nonvolatile memory device of claim 9, wherein the target voltage information indicates a voltage level of about 3.5 volts to about 11 volts.

12. The nonvolatile memory device of claim 9, wherein the program circuit is a part of the memory cell array.

13. A nonvolatile memory device, comprising:
    an address decoder configured to, during a vertical memory string erase operation,
        supply a low voltage to at least one selection line and a plurality of wordlines, and to at least one of float the at least one selection line when a count value of a counter matches a target value, and float the at least one selection line upon a voltage level of a substrate matching a target voltage.

14. The nonvolatile memory device of claim 13, wherein the address decoder is configured to float the at least one selection line upon the voltage level of the substrate matching the target voltage, and the address decoder is configured to float the at least one selection line after the low voltage is supplied.

15. The nonvolatile memory device of claim 13, wherein the address decoder is configured to float the at least one selection line when the count value of the counter matches the target value, and the address decoder is configured to float the at least one selection line after the low voltage is supplied.

16. The nonvolatile memory device of claim 15, wherein the counter begins counting at a beginning of the erase operation.

17. The nonvolatile memory device of claim 15, further comprising:

a substrate bias circuit configured to supply an erase voltage to the substrate during the erase operation, wherein the counter begins counting upon application of the erase voltage to the substrate.

18. The nonvolatile memory device of claim 13, wherein the address decoder is configured to float the at least one selection line based on a signal input from a control logic.

19. A memory system, comprising:
a controller; and
the nonvolatile memory device of claim 13.

20. A computing system, comprising:
a processing unit;
a random access memory;
a user interface;
a power supply;
the memory system of claim 19; and
a bus connecting the processing unit, the random access memory, the user interface, the power supply and the memory system.

* * * * *